(12) United States Patent
Kim et al.

(10) Patent No.: US 11,069,751 B2
(45) Date of Patent: Jul. 20, 2021

(54) DISPLAY DEVICE

(71) Applicant: SAMSUNG ELECTRONICS CO., LTD., Suwon-si (KR)

(72) Inventors: Tae Gon Kim, Hwaseong-si (KR); Sung Hun Lee, Hwaseong-si (KR); Ji Whan Kim, Seoul (KR); Shin Ae Jun, Seongnam-si (KR); Deukseok Chung, Yongin-si (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 14 days.

(21) Appl. No.: 16/668,699

(22) Filed: Oct. 30, 2019

(65) Prior Publication Data

US 2020/0144333 A1    May 7, 2020

(30) Foreign Application Priority Data

Nov. 1, 2018  (KR) .......................... 10-2018-0133124

(51) Int. Cl.
  *H01L 21/00*  (2006.01)
  *H01L 33/00*  (2010.01)
  *H01L 27/32*  (2006.01)
  (Continued)

(52) U.S. Cl.
  CPC .... *H01L 27/322* (2013.01); *H01L 31/035218* (2013.01); *H01L 51/502* (2013.01);
  (Continued)

(58) Field of Classification Search
  CPC .................... H01L 51/502; H01L 31/035218
  (Continued)

(56) References Cited

U.S. PATENT DOCUMENTS

| 8,405,063 B2 | 3/2013 | Coe-Sullivan et al. |
| 8,759,850 B2 | 6/2014 | Coe-Sullivan et al. |

(Continued)

FOREIGN PATENT DOCUMENTS

| CN | 103646957 A | 3/2014 |
| EP | 2874194 A2 | 5/2015 |

(Continued)

OTHER PUBLICATIONS

Extended European Search Report dated Apr. 17, 2020, of the corresponding European Patent Application No. 19206281.8.

*Primary Examiner* — Calvin Lee
(74) *Attorney, Agent, or Firm* — Cantor Colburn LLP

(57) ABSTRACT

A display device including a light source including a first electrode having a light reflectance for a first light of greater than or equal to about 60%; an organic light emitting layer disposed on the first electrode and emitting the first light; and a second electrode disposed on the organic light emitting layer and having a light transmittance in a visible wavelength region of greater than or equal to about 70%, wherein the light source has a first absorption peak in a wavelength region of about 650 nanometers (nm) to about 750 nm or a second absorption peak in a wavelength region of about 550 nm to about 600 nm at a viewing angle of about 55 degrees to about 85 degrees, and a color filter layer disposed above the light source and including a quantum dot configured to convert the first light into a second light.

23 Claims, 20 Drawing Sheets

(51) Int. Cl.
*H01L 51/52* (2006.01)
*H01L 51/56* (2006.01)
*H01L 31/0352* (2006.01)
*H01L 51/50* (2006.01)

(52) U.S. Cl.
CPC ...... *H01L 51/5218* (2013.01); *H01L 51/5234* (2013.01); *H01L 51/5268* (2013.01); *H01L 51/5275* (2013.01); *H01L 51/56* (2013.01); *H01L 2251/5369* (2013.01)

(58) Field of Classification Search
USPC .......................... 438/29, 69–72; 257/98, 103
See application file for complete search history.

(56) References Cited

U.S. PATENT DOCUMENTS

| | | | |
|---|---|---|---|
| 8,947,619 B2 | 2/2015 | Li et al. | |
| 10,365,509 B2 | 7/2019 | Jeon et al. | |
| 10,510,801 B2* | 12/2019 | Sato | H05B 33/145 |
| 10,590,340 B2* | 3/2020 | Jang | H01L 27/3211 |
| 10,720,607 B2* | 7/2020 | Song | H01L 51/5256 |
| 2015/0102291 A1 | 4/2015 | Park et al. | |
| 2015/0228697 A1 | 8/2015 | Liu et al. | |
| 2015/0318506 A1 | 11/2015 | Zhou et al. | |
| 2017/0125740 A1 | 5/2017 | Lee et al. | |
| 2017/0148860 A1 | 5/2017 | Park et al. | |
| 2017/0187005 A1 | 6/2017 | Li et al. | |
| 2018/0047800 A1 | 2/2018 | Choi et al. | |
| 2020/0168667 A1* | 5/2020 | Kim | H01L 51/5271 |

FOREIGN PATENT DOCUMENTS

| | | |
|---|---|---|
| JP | 2010151880 A | 7/2010 |
| KR | 1604096 A | 3/2016 |
| KR | 20170080855 A | 7/2017 |
| KR | 20170099026 A | 8/2017 |

* cited by examiner

DISPLAY DEVICE

CROSS-REFERENCE TO RELATED APPLICATION

This application claims priority to and the benefit of Korean Patent Application No. 10-2018-0133124 filed in the Korean Intellectual Property Office on Nov. 1, 2018, and all the benefits accruing therefrom under 35 U.S.C. § 119, the entire content of which in its entirety is herein incorporated by reference.

BACKGROUND

1. Field

A display device capable of displaying an image is disclosed.

2. Description of the Related Art

As a display device, a liquid crystal display, a plasma display device, an organic light emitting display, or the like may be driven by providing pixels emitting each of red light, green light, blue light and/or white light and individually emitting light, or passing light emitted by a light source through a color filter to express, e.g., display, colors corresponding to the pixels.

A display device including pixels individually emitting light may have high color purity to provide excellent image quality, but each pixel may be formed with different materials and may have characteristics that differ from one another, and it may be difficult to produce such a display device on a large scale.

While a display device passing light from a light source through a color filter may be produced on a larger scale than a display device including pixels individually emitting light, light may be absorbed by the color filter, energy loss of the emitted light may be unavoidable, and a luminance and a color purity may be deteriorated since the final emitted light may have a wide full width at half maximum (FWHM).

SUMMARY

An embodiment provides a display device minimizing an energy loss of emitted light and providing high photo-efficiency, color purity, and color reproducibility.

According to an embodiment, a display device includes a light source including a first electrode having a light reflectance for a first light of greater than or equal to about 60%; an organic light emitting layer disposed on the first electrode, the organic light emitting layer emitting the first light; and a second electrode disposed on the organic light emitting layer, the second electrode having a light transmittance in a visible wavelength region of greater than or equal to about 70%, wherein the light source has a first absorption peak in a wavelength region of about 650 nanometers (nm) to about 750 nm or a second absorption peak in a wavelength region of about 550 nm to about 600 nm at a viewing angle of about 55 degrees to about 85 degrees, and a color filter layer disposed above the light source, the color filter layer including a quantum dot configured to convert the first light into a second light.

The light source may exhibit a radiance decrease of less than or equal to about 20% at a viewing angle of greater than 0 degree and less than or equal to about 40 degrees.

A center wavelength of the second light may be less than a center wavelength of the first absorption peak.

An effective absorption with respect to the second light of the light source may be less than or equal to about 20%.

A center wavelength of the second light may be less than a center wavelength of the second absorption peak.

The color filter layer further include a quantum dot configured to convert the first light into a third light different from the second light, a center wavelength of the second light may be less than a center wavelength of the first absorption peak, and a center wavelength of the third light may be less than a center wavelength of the second absorption peak.

The first light may have a center wavelength in a wavelength region of about 440 nm to about 550 nm.

The first electrode may include silver (Ag), aluminum (Al), gallium (Ga), indium (In), gold (Au), platinum (Pt), nickel (Ni), tungsten (W), chromium (Cr), molybdenum (Mo), iron (Fe), cobalt (Co), copper (Cu), palladium (Pd), titanium (Ti), indium tin oxide (ITO), or a combination thereof.

The quantum dot may include a Group II-VI compound, a Group III-V compound, a Group IV-VI compound, a Group IV compound, a Group II-III-VI compound, a Group I-II-IV-VI compound, or a combination thereof.

The color filter layer may further include a light scattering material.

A first pixel area, a second pixel area, and a third pixel area may be defined in the organic light emitting layer, and each of the first pixel area, the second pixel area, and the third pixel area may emit the first light.

The first pixel area, the second pixel area, and the third pixel area may be defined in the organic light emitting layer, and the color filter layer may include a first color filter, a second color filter, and a third color filter at positions which overlap the first color filter, the second color filter, and the third pixel area, respectively.

The second color filter may include the quantum dot configured to convert the first light into second light, and third color filter may include a second quantum dot configured to convert the first light into a third light different from the second light.

The display device may be disposed between the second electrode and the color filter layer and may further include a light-focusing layer configured to focus the first light emitted from the organic light emitting layer into the color filter layer.

The light-focusing layer may include a convex lens, a micro prism, a plane lens, a Fresnel lens, a metamaterial, or a combination thereof.

A first pixel area, a second pixel area, and a third pixel area may be defined in the organic light emitting layer, and the light-focusing layer may include a first light-focusing portion, a second light-focusing portion, and a third light-focusing portion at positions overlapping the first pixel area, the second pixel area, and the third pixel area, respectively.

The display device may further include an optical filter layer disposed on the color filter layer, the optical filter layer configured to block at least a portion of the first light.

The optical filter layer may block light having a wavelength of less than or equal to about 500 nm.

A first pixel area, a second pixel area, and a to third pixel area may be defined in the organic light emitting layer, and the optical filter layer may be disposed at a position overlapping the second pixel area, a position overlapping the third pixel area, or a combination thereof.

The optical filter layer may be integrally formed at positions other than the position overlapping the first pixel area.

The first light may be blue light and the second light may be red light.

The color filter layer may further include a quantum dot configured to convert the first light into green light The display device may minimize an energy loss of emitted light and provide high photo-efficiency, color purity, and color reproducibility.

DETAILED DESCRIPTION

Figure 1:
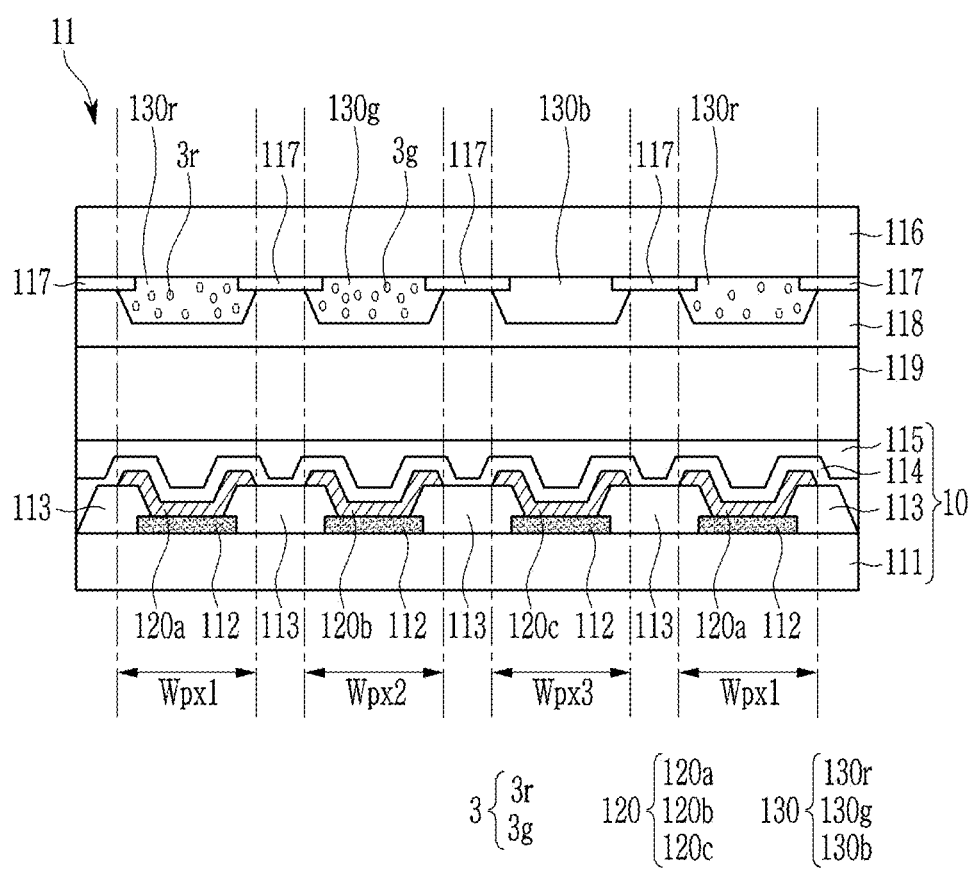
FIG. 1 is a cross-sectional view of a display device according to an embodiment.

Hereinafter, example embodiments of the present invention will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a structure of a display device 11 according to an embodiment is described referring to FIG. 1.

Referring to FIG. 1, a display device 11 according to an embodiment includes a light source 10 including a first substrate 111, two or more first electrodes 112 disposed on the first substrate 111, a pixel define layer 113 disposed between adjacent first electrodes 112 and an organic light emitting layer 120 disposed on each first electrode 112 and configured to emit first light, a second electrode layer 114 disposed on the organic light emitting layer 120, a first planarization layer 115 disposed on the second electrode layer 114, a sealing layer 119 disposed on the first planarization layer 115, a second planarization layer 118 disposed on the sealing layer 119, a color filter layer 130 disposed on the second planarization layer 118 and including quantum dots 3 to convert the first light into a second light and/or a third light that are different from each other, and a second substrate 116 disposed on the color filter layer 130.

The display device 11 according to an embodiment includes the light source 10 including the organic light emitting layer 120 and the color filter layer 130 including the quantum dots 3. The light source 10 according to an embodiment supplies light to the color filter layer 130 through the organic light emitting layer 120 and the supplied light is supplied to the quantum dots 3 in the color filter layer 130. As a result, light finally emitted to the outside of the display device 11 through the light source 10 and the color filter layer 130 may include light which is converted by quantum dots 3 to have a predetermined wavelength region.

The quantum dots 3 have a discontinuous energy band gap by the quantum confinement effect so as to convert incident light to light having a predetermined wavelength and to radiate the same. The quantum dots 3 may control to narrow a full width at half maximum (FWHM) of a light-emitting wavelength spectrum in several tens nanometers (e.g., less than or equal to about 50 nm, less than or equal to about 40 nm, or less than or equal to about 30 nm). In an embodiment, the control to narrow an FWHM be from about 20 to about 50 nm, or about 20 to about 40 nm, or about 20 to about 30 nm. In another embodiment, the control to narrow an FWHM may be from about 30 to about 50 nm, or about 30 to about 40 nm. Thus, the display device 11 according to an embodiment may express, e.g., display, an image having improved color purity and color reproducibility due to the quantum dots 3.

The display device 11 according to an embodiment may be driven in a top-emission manner in which light supplied from the light source 10 is emitted to the outside through the color filter layer 130. The top-emission driving system may more favorable to a bottom-emission driving system with respect to an aperture ratio of each pixel area. Accordingly, the display device 11 according to an embodiment may exhibit a high luminance image using top-emission.

According to an embodiment, the process temperature of forming the color filter layer 130 including quantum dots 3 is different from the temperature of forming the organic light emitting layer 120, and a first panel including the light source 10 and a second panel including the color filter layer 130 are attached to one another after fabricating each of the first panel including the light source 10 and the second panel including the color filter layer 130.

Thus, hereinafter, constituent elements included in the first panel and constituent elements included in the second panel will be sequentially described in detail.

According to an embodiment, the first panel of the display device 11 may have a structure in which the first substrate 111 constituting the light source 10, the first electrode 112, the pixel define layer 113, the organic light emitting layer 120, the second electrode layer 114, and the first planarization layer 115 are laminated sequentially.

The first substrate 111 may include an insulating material and may have flexibility. For example, the first substrate 111 may be formed of glass, quartz, and ceramic or may be a flexible substrate made of a plastic. The substrate 110 may be made of a polymer material such as polyimide (PI), polycarbonate (PC), polyethersulfone (PES), polyethylene terephthalate (PET), polyethylene naphthalate (PEN), polyarylate (PAR), a fiberglass reinforced plastic (FRP), or the like. The first substrate 111 may be transparent, semi-transparent, or opaque.

The first electrode 112 according to an embodiment may function as an anode of the light source 10. The first electrode 112 may include a material having relatively excellent light reflectance with respect to the first light. Thereby, at least a portion of the first light emitted from the organic light emitting layer 120 may be reflected by the first electrode 112 and may penetrate the color filter layer 130. In addition, first lights that return from the color filter layer 130 toward the first electrode 112 may be reflected by the first electrode 112 and may return toward the color filter layer 130.

That is, the first electrode 112 may guide, e.g., direct, optical paths of at least a portion of the first light emitted from the organic light emitting layer and/or the first light returned from, e.g., reflected by, the color filter layer 130.

In an embodiment, a light reflectance with respect to the first light of the first electrode 112 may be greater than or equal to about 50%, for example greater than or equal to about 55%, greater than or equal to about 60%, greater than or equal to about 65%, greater than or equal to about 70%, greater than or equal to about 75%, greater than or equal to about 80%, greater than or equal to about 85%, greater than or equal to about 90%, or about 95%.

When the light reflectance with respect to the first light of the first electrode 112 satisfies the above-described range, recycling effects of the first light may be improved, and the light efficiency of the display device 11 may be improved.

The first electrode 112 may be a monolayer having a light reflectance with respect to the first light within desirable ranges. However, a structure of the first electrode 112 according to an embodiment is not limited thereto.

For example, the first electrode 112 may include a reflective layer and a transparent layer. The reflective layer may provide light reflectance with respect to the first light within desirable ranges and may be disposed under the transparent layer. The transparent layer may be disposed on the reflective layer and light transmittance with respect to at least first light may be greater than or equal to about 80%, for example greater than or equal to about 90%, greater than or equal to about 95%, greater than or equal to about 99%, or about 100%.

A material of the first electrode 112 is not particularly limited as long as the light reflectance with respect to the first light is within desirable ranges. Specific materials of the first electrode 112 may be silver (Ag), aluminum (Al), gallium (Ga), indium (In), gold (Au), platinum (Pt), nickel (Ni), tungsten (W), chromium (Cr), molybdenum (Mo), iron (Fe), cobalt (Co), copper (Cu), palladium (Pd), titanium (Ti), indium tin oxide (ITO), or a combination thereof, and may be material having light-blocking properties.

The first electrode 112 may have a bilayer structure of a reflective layer made of the materials having light-blocking properties and a transparent layer made of transparent conductive materials such as indium tin oxide (ITO) or indium zinc oxide (IZO) on the reflective layer.

The first electrode 112 according to an embodiment may have a desired light reflectance for the second light and/or the third light, which is different from the first light.

For example, the first electrode 112 may have light reflectance with respect to the second light and/or third light of greater than or equal to about 25%, for example greater than or equal to about 30%, greater than or equal to about 35%, greater than or equal to about 40%, greater than or equal to about 45%, greater than or equal to about 50%, greater than or equal to about 55%, greater than or equal to about 60%, greater than or equal to about 65%, greater than or equal to about 70%, greater than or equal to about 75%, or greater than or equal to about 80%.

The first electrode 112 may have a light reflectance with respect to a visible wavelength region of greater than or equal to about 20% or greater than or equal to about 25%.

When the first electrode 112 has a predetermined light reflectance with respect to other light in the visible light wavelength range as well as the first light, the range of light, e.g., the range of wavelengths of light, that may be guided, e.g., directed, by the first electrode 112 may be increased. That is, it may be possible to optically recycle the second light and/or the third light as well as the first light through the first electrode 112. Therefore, the photo-efficiency of the display device 11 including the first electrode 112 described above may be further improved.

A line layer including a thin film transistor or the like is formed on the first substrate 111. The line layer may further include a gate line, a sustain voltage line, a gate insulating layer, a data line, a source electrode, a drain electrode, a semiconductor, a protective layer, or the like. The detailed structure of the line layer may be verified according to an embodiment.

The gate line and the sustain voltage line are electrically separated from each other, and the data line is insulated from and crosses the gate line and the sustain voltage line. The gate electrode, the source electrode, and the drain electrode form a control terminal, an input terminal, and an output terminal of the thin film transistor, respectively. The drain electrode is electrically connected to the first electrode 112.

Between two adjacent first electrodes 112, a pixel define layer (PDL) 113 overlapping with a terminal end of the first electrode 112 to divide the first electrode 112 into a pixel unit. The pixel define layer 113 is an insulation layer which may electrically block the at least two first electrodes 112.

The pixel define layer 113 covers a portion of the upper surface of the first electrode 112, and the remaining region of the first electrode 112 not covered by the pixel define layer 113 may provide an opening. An organic light emitting layer 120 which will be described later may be formed on the region defined by the opening.

The organic light emitting layer 120 defines each pixel area by the first electrode 112 and the pixel define layer 113. In other words, one pixel area may be defined as an area where one organic light emitting unit layer contacts one first electrode 112 divided by the pixel define layer 113.

For example, in the display device 11 according to an embodiment, the organic light emitting layer 120 may be defined as a first pixel area, a second pixel area, and a third pixel area, and each pixel area is spaced apart from each other with a predetermined interval by the pixel define layer 113. According to an embodiment, unit layers pertaining to the first to third pixel areas in the organic light emitting layer 120 are defined as first to third organic light emitting layers 120a to 120c, respectively.

In addition, according to an embodiment, widths of the first to third pixel areas are represented by "Wpx1", "Wpx2", and "Wpx3", respectively. Each width of the first to third pixel areas is identical to a width of each of the first to third organic light emitting layers 120a to 120c, respectively. And in an embodiment, the terms "overlapping with a pixel area" means to be at the position overlapping an area of "Wpx1", "Wpx2", or "Wpx3".

In an embodiment, the organic light emitting layer 120 may emit the first light belonging to the visible light region or belonging to the ultraviolet (UV) region. That is, each of the first to third pixel areas of the organic light emitting layer 120 may emit the first light. In an embodiment, the first light may be light having a high energy of lights in the visible wavelength region, for example, blue light.

In an embodiment, a center wavelength of the first light may vary depending on materials of the organic light emitting layer 120, and may have a center wavelength belonging to a wavelength range of, for example, about 440 nm to about 550 nm. That is, the center wavelength of the first light may be in a wide range from blue close to purple to blue close to green.

When all the pixel regions of the organic light emitting layer 120 are designed to emit the same light, the respective pixel regions of the organic light emitting layer 120 may be formed of the same or similar materials, or may exhibit the same or similar physical properties. Therefore, difficulty in forming the organic light emitting layer 120 may be decreased, and the light source 10 including the organic light emitting layer 120 may be applied to large-scale/enlargement processes.

The organic light emitting layer 120 may include organic light emitting unit layers in each pixel area, and each of the organic light emitting unit layers may further include an auxiliary layer (e.g., a hole injection layer, a hole transport layer, an electron transport layer, etc.) as well as a light emitting layer.

The second electrode 114 may function as a cathode of the light source 10. The second electrode 114 may be integrally formed on the organic light emitting layer 120. That is, the second electrode 114 may include a common layer that integrally covers the first to third pixel areas. However, an embodiment is not necessarily limited thereto, and second electrode 114 may be formed as a separate layer separated for each pixel area.

In an embodiment, the second electrode 114 may be made of a material having improved light transmittance in a visible wavelength region. For example, the second electrode 114 may be made of a transparent conductive material such as indium tin oxide (ITO), indium zinc oxide (IZO), or a combination thereof.

The second electrode 114 may have a light transmittance in a visible wavelength region of, for example greater than or equal to about 70%, greater than or equal to about 80%, greater than or equal to about 90%, greater than or equal to about 95%, greater than or equal to about 99%, or about 100%. When the light transmittance of the second electrode 114 satisfies the above ranges, the second electrode 114 may transmit the first light emitted from the organic light emitting layer 120 and the light, e.g., all the light (including the second light and the third light, and including the first light when the first light belongs to the visible wavelength region), within the visible wavelength region guided, e.g., directed, by the first electrode 112.

The first planarization layer 115 is formed on the second electrode 114. The first planarization layer 115 may include an insulating material for securing electrical insulation with the second electrode 114. The first planarization layer 115 may include a first layer made of an insulating material and a second layer including an inorganic material, an organic material, or a combination thereof on a surface of the first layer in direct contact with the second electrode 114. In addition, the first planarization layer 115 may have a structure in which a first layer and a second layer or two or more layers of an organic material and an inorganic material may be laminated.

The first panel including the light source 10 according to an embodiment is configured such that the first electrode 112 and second electrode 114 have optically predetermined light reflectance, light transmittance, or a combination thereof as described above.

When the light reflectance of the first electrode 112 is adjusted to a desired level, the visible light, e.g., all of the visible light (including the second light and the third light), belonging to the wavelength region which is received from the outside of the first panel as well as the light (first light) generated inside the first panel may also be reflected and transmitted toward the second panel. Therefore, the display device 11 according to an embodiment may be capable of optically recycling light belonging to all visible wavelength regions, and as a result, may have excellent light efficiency.

The second panel of the display device 11 according to an embodiment includes a second substrate 116, two or more light blocking members 117 formed on the lower surface of the second substrate 116, a color filter layer 130 formed covering spaces between neighboring light blocking members 117, and a second planarization layer 118 formed under the color filter layer 130.

The second substrate 116 may include an insulating material and may have flexibility. For example, the second substrate 116 may be formed of glass, quartz, or ceramic or may be a flexible substrate made of a plastic. The second substrate 116 may be made of a polymer material such as polyimide (PI), poly carbonate (PC), poly ether sulfone (PES), polyethylene terephthalate (PET), polyethylene naphthalate (PEN), polyarylate (PAR), a fiber glass reinforced plastic (FRP), or the like. In addition, the second substrate 116 may be disposed in a direction such that light is emitted through the color filter 130 and the second substrate 116 may be an optically transparent substrate.

The light blocking members 117 may be formed in a position which overlaps with the pixel define layer 113 of the first panel. At least two light blocking members 117 are formed with a predetermined interval between the light blocking members 117, and the first to third color filters 130r, 130g, and 130b of the color filter layer 130 may overlap with the first to third pixel areas, respectively.

The light blocking members 117 may be made of a light-blocking material, for example, a material including a metal, e.g., a metal particle, such as chromium (Cr), silver (Ag), molybdenum (Mo), nickel (Ni), titanium (Ti), tantalum (Ta), or the like, an oxide of the metal, e.g., the metal particle, or a combination thereof. The light blocking members 117 may prevent a light leakage phenomenon of the display device 11 and may improve contrast of the display device 11.

The color filter layer 130 is formed to cover between the neighboring light blocking members 117. The color filter layer 130 includes first to third color filters 130r, 130g, and 130b formed at positions which overlap with the first to third pixel areas, respectively.

According to an embodiment, the first color filter 130r may emit the second light different from the first light, the second color filter 130g may emit the third light different from the first light, and the third color filter 130b may emit the first light, respectively.

In an embodiment, the first light may be blue light, the second light may be red light and the third light may be green light. However, an embodiment is not necessarily limited thereto and as described above the first light may be UV light, the second light may be magenta light, and the third light may be cyan light. Likewise, the first light to third light may be changed according to the quantum dots 3, the used materials of the organic light emitting layer 120, or the like.

The color filter layer 130 may include quantum dots 3 converting the first light supplied from the organic light emitting layer 120 to the second light and/or the third light According to an embodiment, the quantum dots 3 may include first quantum dots 3r included in the first color filter 130r and second quantum dots 3g included in the second color filter 130g.

In an embodiment, the first and second color filter layers 130r and 130g may include the first and second quantum dots 3r and 3g, respectively, and each of the first and second color filter layers 130r and 130g may be obtained by coating first and a second photosensitive compositions including a binder, a photopolymerizable monomer, a photoinitiator, and a solvent on the first and second pixel areas shown in FIG. 1, respectively and curing the same.

The first quantum dots 3r and second quantum dots 3g may be formed of the same material but may have different sizes from each other, and the incident third light may be differently emitted as first light and second light which are different from each other.

For example, the second quantum dots 3g may have a smaller size than the first quantum dots 3r, and the second quantum dots 3g may emit green light may having a center wavelength of about 535±10 nm, a full width at half maximum (FWHM) of about 30 to 60 nm, and relatively high energy. The first quantum dots 3r may have a larger size than the second quantum dots 3g so as to emit red light having a center wavelength of 630±10 nm, a full width at half maximum (FWHM) of about 30 nm to about 60 nm, and relatively low energy.

However, an embodiment is not necessarily limited thereto, but the first and second quantum dots 3r and 3g may have the same sizes but may be formed of different materials from each other.

Shapes of the quantum dots 3 may not be particularly limited. The quantum dots 3 may have a spherical shape as shown in FIG. 1, or may have for example a pyramidal shape, a multi-armed shape, a cube nanoparticle shape, a nanotube shape, a nanowire shape, a nanofiber shape, or a nanosheet shape.

In an embodiment, a material of the quantum dots 3 is not particularly limited. For example, the quantum dots may include a Group II-VI compound, a Group III-V compound, a Group IV-VI compound, a Group IV compound, or a combination thereof.

The Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof.

The Group IV compound may be a single substance such as Si, Ge, or a combination thereof; a binary element compound such as SiC, SiGe, or a combination thereof; or a combination thereof.

The binary element compound, the ternary element compound or the quaternary element compound respectively exist in a uniform concentration in the particle or in partially different concentrations in the same particle. The quantum dots 3 may have a core/shell structure in which one quantum dot surrounds another quantum dot. The core and the shell may have a concentration gradient wherein the concentration of the element(s) of the shell decreases toward the core. In addition, the quantum dots 3 may have one semiconductor nanocrystal core and multi-shells surrounding the core. Herein, the multi-layered shell structure has a structure of two or more shells and each layer may have a single composition or an alloy or may have a concentration gradient.

In addition, the quantum dots 3 have a material composition of the shell has a larger energy bandgap than that of the core, which may exhibit an effective quantum confinement effect. In the multi-layered shell, a shell that is outside of the core has may have a larger energy bandgap than a shell that is near, e.g., closer to, the core and quantum dots may have an ultraviolet (UV) to infrared wavelength range.

The quantum dots 3 may have quantum efficiency of greater than or equal to about 10%, for example, greater than or equal to about 30%, greater than or equal to about 50%, greater than or equal to about 60%, greater than or equal to about 70%, or greater than or equal to about 90%.

In an embodiment, the third color filter layer 130*b* may be formed in a transparent body, and the first light supplied from the organic light emitting layer 120 may be emitted without being converted. That is, the third color filter layer 130*b* according to an embodiment may not include quantum dots 3 unlike the first and second color filter layers 130*r* and 130*g*.

According to an embodiment, the first to third color filters 130*r*, 130*g*, and 130*b* may have the same width as the widths Wpx1, Wpx2, and Wpx3 of the first to third pixel areas, respectively, and unintended cross talk in, e.g., interference between, the first to third color filters 130*r*, 130*g*, and 130*b* may be minimized.

Each of the first to third color filter layers 130*r*, 130*g*, and 130*b* may further include a light scattering material which does not change a wavelength of the third light but only changes a propagation direction thereof. The light scattering material functions to uniformly scatter the first light supplied to the first to third color filter layer 130*r*, 130*g*, and 130*b*. Thereby, a probability that the first and second quantum dots 3*r* and 3*g* meet, e.g., are contacted by, the first light in the case of the first and second color filter layers 130*r* and 130*g* may be increased while in the case of the third color filter layer 130*b*, the first light may be evenly spread in the third pixel area.

The light scattering material may include a light scattering-inducing particle. Representative examples of materials usable as the light scattering-inducing particles include $TiO_2$, but are not limited thereto. Various scattering-inducing particles or mixtures of various scattering-inducing particles can be used to perform a light scattering function.

The scattering-inducing particles may have an average particle size of, for example, several to several hundred nanometers, for example, several to several ten nanometers.

The light scattering material increases an excitation possibility of the first and second quantum dots 3*r* and 3*g* as mentioned above but simultaneously scatters the first light in a random direction. Thus at least a portion of the scattered first light is returned, e.g., reflected, to a first panel.

In addition, at least a portion of the second light and/or the third light emitted by quantum dots 3 is returned, e.g., reflected, to the first panel by the isotropic light emitting characteristics.

Thus even if the color purity and the color reproducibility of the emitted light may be enhanced by using the color filter layer 130 including quantum dots 3 and the light scattering material, lights returning, e.g., reflected, to the first panel may be generated, as mentioned above.

However, the display device 11 according to an embodiment returns, e.g., reflects, lights to the first panel using the first electrode 112 to send, e.g., direct, the same to the second panel. Thus the display device 11 according to an embodiment may significantly improve the light recycle in the device using the first electrode 112 and the color filter layer 130 together. As a result, photo-efficiency of the display device 11 may be improved.

The second planarization layer 118 is formed directly under the color filter layer 130. The second planarization layer 118 may have the same material, disposition structure, or a combination thereof as in the first planarization layer 115, or may have different material from the first planarization layer 115.

The second planarization layer 118 performs planarization of the lower surface of the color filter layer 130. That is, the second planarization layer 118 may be in contact with the sealing layer 119, and a contact surface between the second panel and the sealing layer 119 may be planarized so that the second panel is not separated from an upper surface of the first panel or lifted therefrom.

The second planarization layer 118 may be formed of an optically transparent material. In an embodiment, the second planarization layer 118 may have an absorption, for light within a visible light region, of less than or equal to about 10%, for example, less than or equal to about 9%, less than or equal to about 8%, less than or equal to about 7%, less than or equal to about 6%, less than or equal to about 5%, less than or equal to about 4%, less than or equal to about 3%, less than or equal to about 2%, less than or equal to about 1%, or about 0%.

The sealing layer 119 may be disposed between the first panel and second panel. The sealing layer 119 is formed between the first planarization layer 115 and second planarization layer 118 and seals the first panel. The sealing layer 119 protects the organic light emitting layer 120 in the light source 10 from external moisture, oxygen, or the like. The sealing layer 119 may include a getter absorbing moisture. The sealing layer 119 may include a getter layer including at least one getter.

The sealing layer 119 may also function to attach the first panel to the second panel, and the first panel may be firmly attached to the second panel to function as one display device 11.

Hereinafter, the light recycling effect of the display device 11 according to an embodiment is described with reference to FIG. 2.

Figure 2:
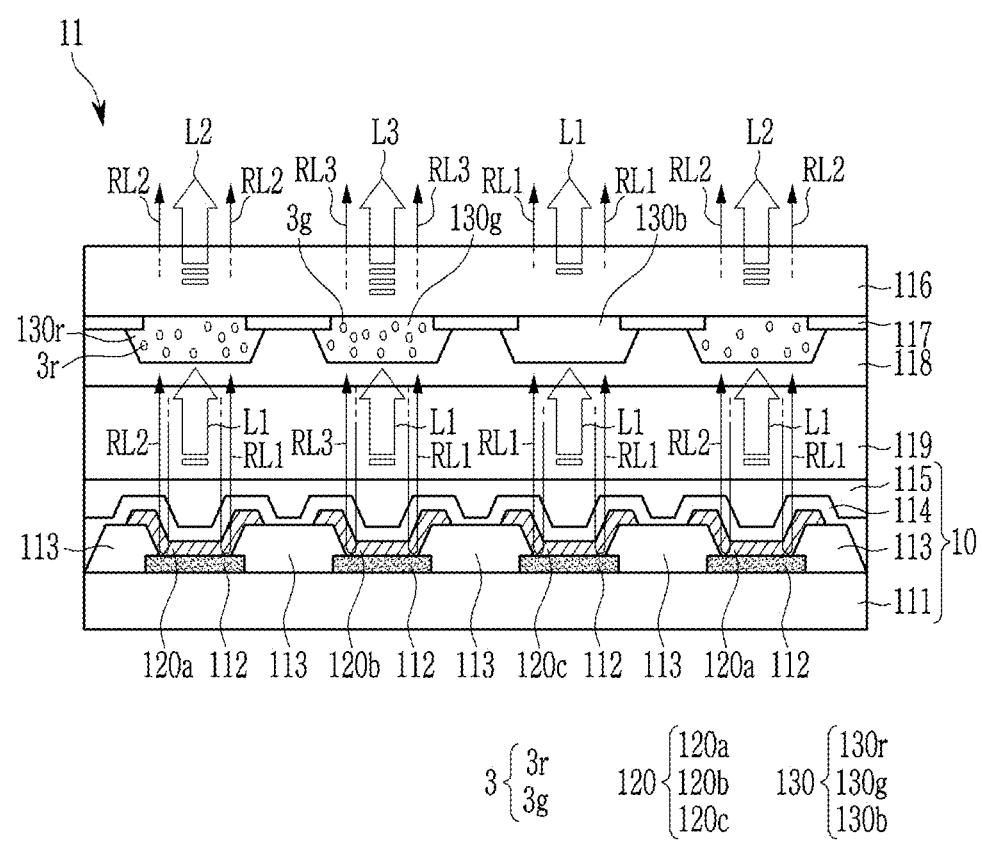
FIG. 2 is a cross-sectional view showing an optical path inside/outside at the time of driving a display device according to an embodiment.

FIG. 2 is a cross-sectional view showing an optical path inside/outside at the time of driving a display device according to an embodiment.

Referring to FIG. 2, the first light L1 emitted from the organic light emitting layer 120 enters each of the first to third color filters 130r, 130g, and 130b. In the incident first lights L1, a portion of the light converted by meeting, e.g., contacting, the first and second quantum dots 3r and 3g passes through the second substrate 116 and is emitted as the second light L2 and the third light L3, respectively. In addition, a portion of the first light L1 enters the third color filter 130b after having passed through the second substrate 116 as is and is emitted as the first light L1.

However, according to the isotropic light emitting characteristics of quantum dots 3 or the scattering direction of the light scattering material, lights may be returned, e.g., reflected, in a direction of the first panel in each pixel. The returning, e.g., reflected, light includes at least the first light, and also may further include second light or third light, etc. in each pixel.

The returning, e.g., reflected, first light and/or second light, and third light are reflected at the first electrode 112 and returned, reflected, in a direction of the second panel. The returned, e.g., reflected, first light RL1 and/or second light RL2, and third light RL3 enters the first to third color filters 130r, 130g, and 130b, again.

Among the returned, e.g., reflected, first lights RL1, lights re-entering the first and second color filters 130r and 130g may meet, e.g., contact, the first and second quantum dots 3r, 3g and may be converted to second light RL2 and third light RL3. Accordingly, the display device 11 according to an embodiment has both directly-emitted lights (e.g., L2 in a case of the first pixel area) without being reflected by the first electrode 112 and reflected lights (e.g., RL2 in a case of the first pixel area) emitted by being reflected by the first electrode 112 once or more, at the same time.

Accordingly, the display device 11 according to an embodiment may improve the inner light recycling effects using the first electrode 112 and quantum dots 3 in the color filter layer 130, and photo-efficiency may be improved.

Hereinafter, a variety of modifications of the display devices 11, 11'', and 11''' according to an embodiment is described with references to FIGS. 3 to 12. For describing the modifications, the detailed descriptions for the constituent elements performing the same structures/functions as in the display device 11 according to an embodiment are omitted.

Figure 3:
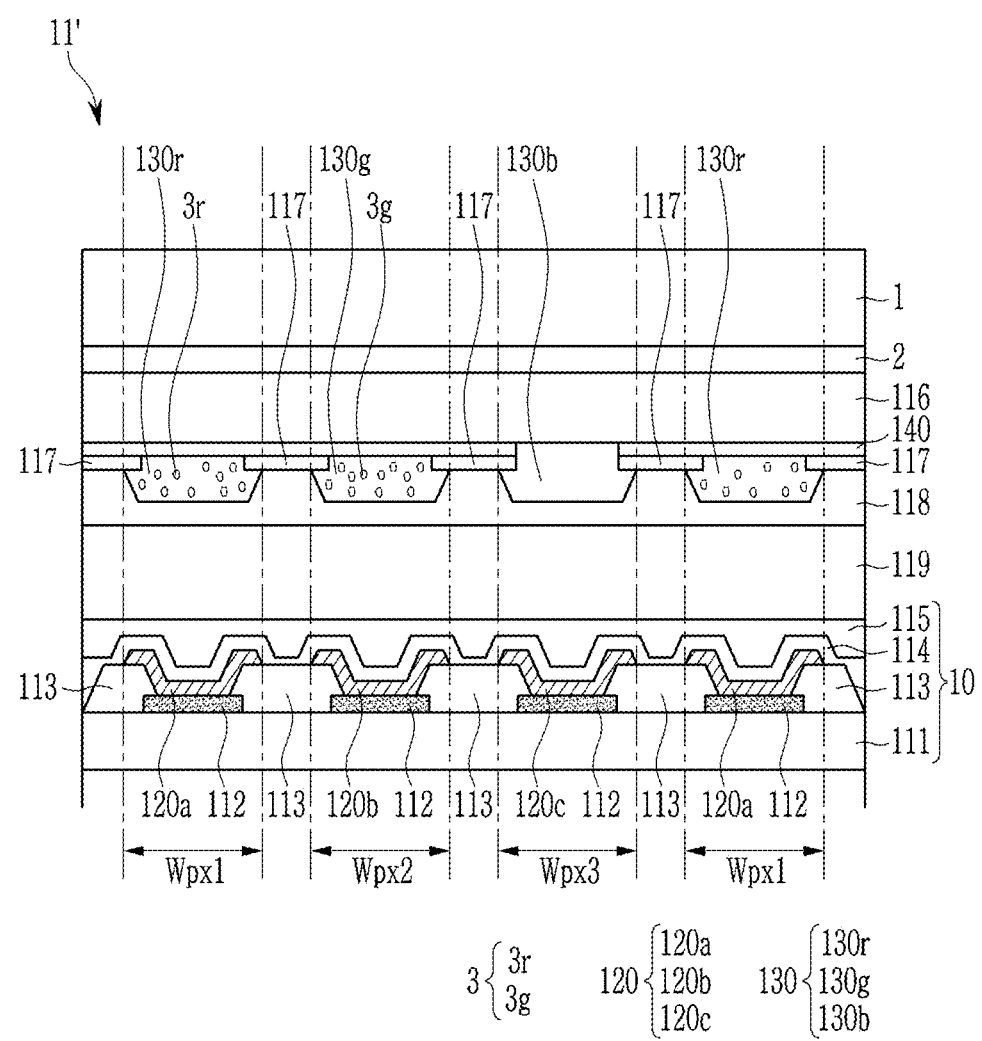
FIG. 3 is a cross-sectional view showing a display device according to an embodiment.

FIG. 3 is a cross-sectional view showing a display device according to an embodiment.

Referring to FIG. 3, in the display device 11' according to an embodiment, the optical filter layer 140 is further disposed in a region pertaining to the second panel, and an adhesive layer 2 and a cover layer 1 are further formed on the upper surface of the second substrate 116.

The optical filter layer 140 according to an embodiment may be disposed on the color filter layer 130. For example, the optical filter layer 140 may be disposed between the second substrate 116 and the color filter layer 130 as shown in FIG. 3, for example, may be disposed between the second substrate 116 and the light blocking member 117. But, the specific disposition of the optical filter layer 140 is not necessarily limited, and the optical filter layer 140 may be disposed in the various paths in which light emitted from the color filter layer 130 passes through, for example, may be disposed between the light blocking member 117 and the color filter layer 130 or directly on the second substrate 116, or the like.

The optical filter layer 140 may be formed at at least one position which overlaps with the second pixel area and at least one position which overlaps with the third pixel area.

In an embodiment of FIG. 3, the optical filter layer 140 may be formed at all the positions which overlap with the first and second pixel areas.

The optical filter layer 140 may be integrated with the remaining positions except for the position which overlaps with the first pixel area.

The optical filter layer 140 may block light having, for example, a predetermined wavelength region in the visible light region and may transmit light in the other wavelength regions. The optical filter layer 140 may block, for example at least the first light. For example, the optical filter layer 140 may block blue light and may transmit light except for the blue light. For example, the optical filter layer 140 may transmit green light, red light and/or yellow light, which is a mixed color thereof, e.g., yellow light is a mix of green light and red light.

The optical filter layer 140 may substantially block, for example, light having a wavelength of less than or equal to about 500 nm and may transmit other visible light of, for example greater than about 500 nm and less than or equal to about 700 nm. For example, the optical filter layer 140 may have light transmittance of greater than or equal to about 70%, greater than or equal to about 80%, greater than or equal to about 90%, or about 100% with respect to other visible light of greater than about 500 nm and less than or equal to about 700 nm.

The optical filter layer 140 may be a polymer thin film including a dye, a pigment, or a combination thereof absorbing a wavelength which is to be blocked, and may absorb blue light at greater than or equal to about 80%, greater than or equal to about 90%, greater than or equal to about 95%, but may have a light transmittance of greater than or equal to about 70%, greater than or equal to about 80%, greater than or equal to about 90%, or about 100% with respect to the other visible light at greater than about 500 nm and less than or equal to about 700 nm.

The optical filter layer 140 may be a reflective filter including a plurality of layers having different refractive indexes. For example, the optical filter layer 140 may be formed by alternately laminating two layers having different refractive indexes, for example, by alternately laminating a layer having a high refractive index and a layer having a low refractive index.

Due to a difference in the refractive index between the layer having a high refractive index and the layer having a low refractive index, the optical filter layer 140 may have desirable wavelength selectivity.

A thickness and the number of layers in, e.g., the laminating number of, the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

The total thickness of the optical filter layer 160 may be, for example, from about 3 nm to about 10,000 nm, about 300 nm to about 10,000 nm, or about 1,000 nm to about 10,000 nm. Each of the layers having a high refractive index may have the same thickness and may include the same material or may include a different material from each other, and each of the layers having a low refractive index may have the same thickness and may include the same material or may include a different material from each other.

In addition, the optical filter layer 140 may be formed by binding, e.g., laminating, a reflective filter that includes materials having different refractive indexes laminated under the absorptive optical filter, wherein at least two layers thereof are alternately laminated, or the at least two layers thereof form at least two layers.

As described above, the optical filter layer 140 transmits green light, red light, and/or yellow light which is a combined light thereof, or the like, except for light in the blue wavelength region, but the optical filter layer 140 may block blue light, and the display device 11' may express, e.g., display, an image having improved color purity and color reproducibility.

The adhesive layer 2 and the cover layer 1 may be sequentially laminated on the optical filter layer 140.

The adhesive layer 2 may perform functions of attaching and fixing the cover layer 1 and the optical filter layer 140.

The cover layer 1 performs a function of protecting the internal constituent elements of the display device 11' from the outside. The cover layer 1 may include, for example, an overcoat layer, a window layer, or the like. But the embodiment is not necessarily limited thereto, and the cover layer 1 and the adhesive layer 2 may be modified or omitted.

Figure 4:
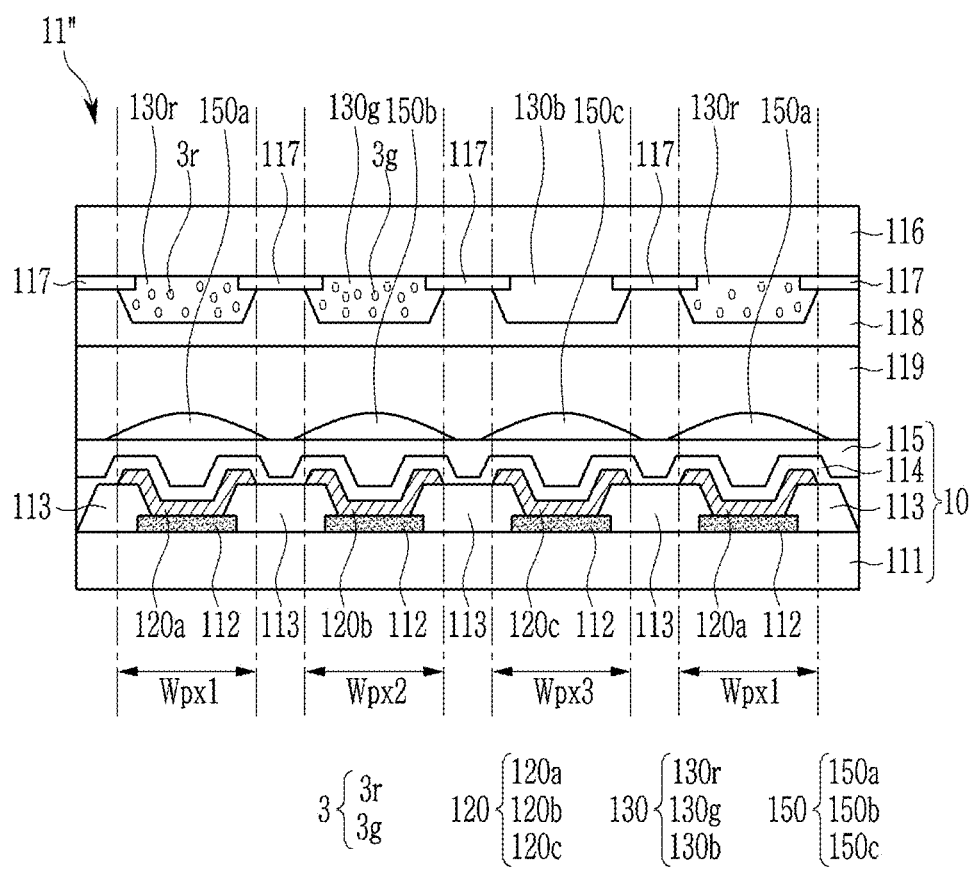
FIG. 4 is a cross-sectional view showing a display device according to an embodiment.

FIG. 4 is a cross-sectional view showing a display device according to an embodiment.

Referring to FIG. 4, the display device 11" according to an embodiment may include a light-focusing layer 150 disposed between the second electrode 114 and the color filter layer 130 and focusing the first light emitted from the organic light emitting layer 120 to, e.g., toward, the color filter layer 130.

The light-focusing layer 150 is disposed on the flat upper surface of the first planarization layer 115. The light-focusing layer 150 may include first to third light-focusing parts 150a to 150c disposed on positions which overlap with the first to third pixel areas.

The light-focusing layer 150 controls a path of the first light so that the first light emitted from the organic light emitting layer 120 enters the color filter layer 130 which will be described later. In other words, each of the first to third light-focusing parts 150a to 150c controls a light path scattering to adjacent pixel regions, among the first light emitted from each of the first to third organic light emitting layers 120a to 120c, and the light path may be positioned in the current pixel region.

The light-focusing layer 150 may prevent the third light emitted from each pixel area of the organic light emitting layer 120 from being scattered to an adjacent other pixel region, and unintended cross talk in, e.g., interference between, the first to third color filters 130r, 130g, and 130b may be minimized. In other words, the display device 11" according to an embodiment of FIG. 4 may control the light path of the third light by the light-focusing layer 150, and an image having a high color uniformity in each pixel may be expressed, e.g., displayed.

A refractive index of the light-focusing layer 150 may vary with a material, a refractive index, a thickness, or the like of the neighboring first planarization layer 115 or sealing layer 119, but the refractive index may be, for example, greater than or equal to about 1.5, greater than or equal to about 1.6, greater than or equal to about 1.7, greater than or equal to about 1.8, greater than or equal to about 1.9, or greater than or equal to about 2.0 and for example less than or equal to about 2.8, less than or equal to about 2.7, less than or equal to about 2.6, less than or equal to about 2.5, or less than or equal to about 2.4, or about 1.5 to about 2.5, or about 1.5 to about 2.0.

When the light-focusing layer 150 has a refractive index within a desirable range, the light-focusing layer 150 may exhibit a relatively high refractive index in a relationship with, e.g., relative to, the neighboring other constituent elements, and the light-focusing layer 150 may not spread the third light emitted from the organic light emitting layer 120 but may focus the same.

Each of the first to third light-focusing parts 150a to 150c in the light-focusing layer 150 may have a variety of sizes, shapes, disposition relationships, e.g., relative positions, or a combination thereof.

FIGS. 5 to 8 are views showing various examples of shapes of light-focusing parts.

For example, each of the first to third light-focusing parts 150a to 150c may include a convex lens (referring to FIG. 5), a micro-prism (referring to FIG. 6), a planar lens (referring to FIG. 7), a Fresnel lens (referring to FIG. 8), a meta-material or a combination thereof. For example, each the first to third light-focusing parts 150a to 150c may include a convex lens as shown in FIG. 4, or the first light-focusing part 150a includes a convex lens, and second to the third light-focusing parts 150b and 150c may each include a micro-prism, a planar lens, a Fresnel lens, or a meta-material.

When at least one of the first to third light-focusing parts 150a to 150c includes a convex lens, a tilting angle ($\varphi$) of the convex lens may vary with a material, a refractive index, a thickness, or the like of the neighboring first planarization layer 115 or sealing layer 119, but the tilting angle may be, for example, greater than or equal to about 40 degrees, for example greater than or equal to about 50 degrees, greater than or equal to about 60 degrees, and for example, less than or equal to about 90 degrees or less than or equal to about 80 degrees, about 50 degrees to about 90 degrees, or about 60 degrees to about 80 degrees.

Figure 5:
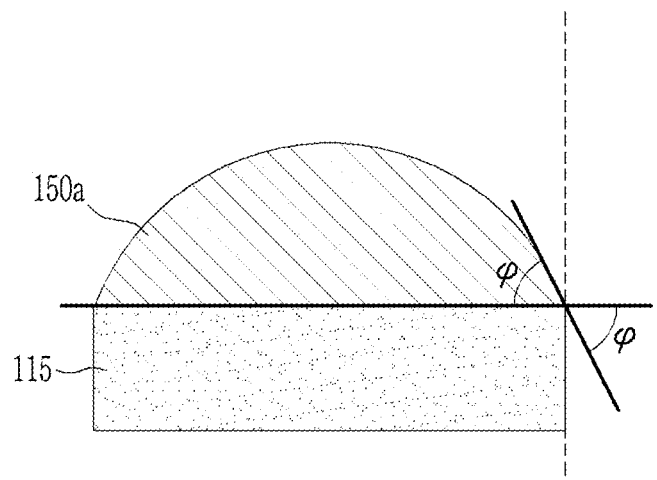
FIGS. 5 to 8 are views showing various examples of shapes of light-focusing parts.

That is, referring to FIG. 5, for example, when the first light-focusing part 150a is formed of a convex lens, a tilting angle (φ) of the first light-focusing part 150a from the upper surface of the first planarization layer 115 may be within a desirable range.

When at least one of the first to third light-focusing parts 150a to 150c includes a micro-prism, a tilting angle of the micro-prism may vary with a material, a refractive index, a thickness, or the like of the neighboring first planarization layer 115 or sealing layer 119, but the tilting angle may be, for example, greater than or equal to about 20 degrees, greater than or equal to about 30 degrees, greater than or equal to about 40 degrees, greater than or equal to about 50 degrees and, for example, less than about 90 degrees or less than or equal to about 80 degrees, or for example, about 20 degrees to about 80 degrees.

Figure 6:
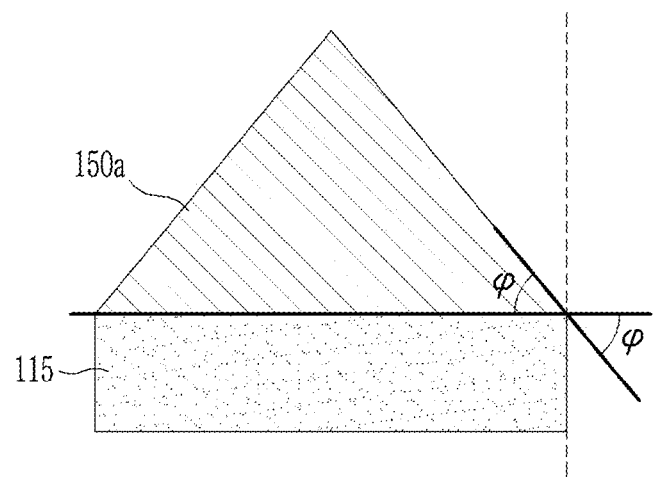
Figure 7:
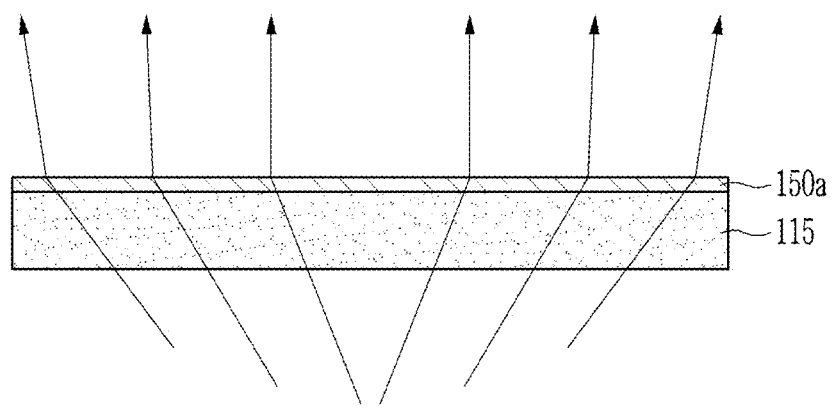
Figure 8:
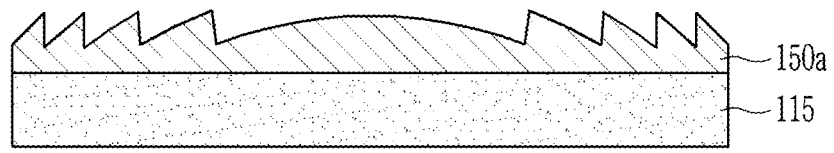

That is, referring to FIG. 6, for example when the first light-focusing part 150a is formed of a micro-prism, a tilting angle ((p) of the first light-focusing part 150a from the upper surface of the first planarization layer 115 may be within a desirable range.

When the tilting angle of the convex lens, the micro-prism, or a combination thereof is within a desirable range, the convex lens, the micro-prism, or a combination thereof may effectively focus the first light which is emitted near, e.g., close to, both sides of the organic light emitting layer 120 and is spread to an adjacent pixel area in the optical path although the gap between the organic light emitting layer 120 and the color filter layer 130 may be increased.

Figure 9:
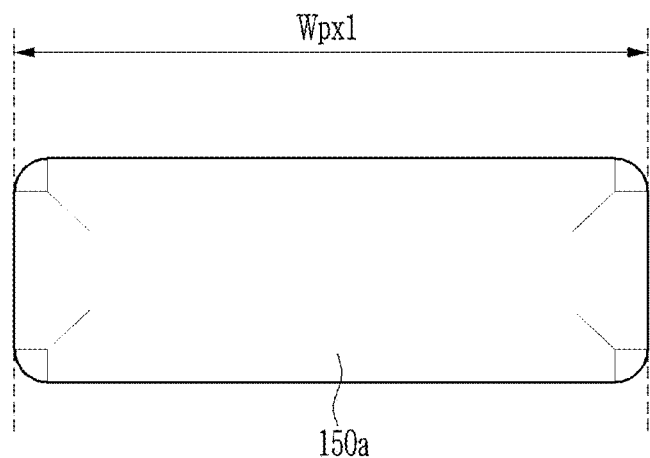
FIGS. 9 to 11 are views showing various arrangement relationships in pixel areas of the light-focusing parts.
Figure 10:
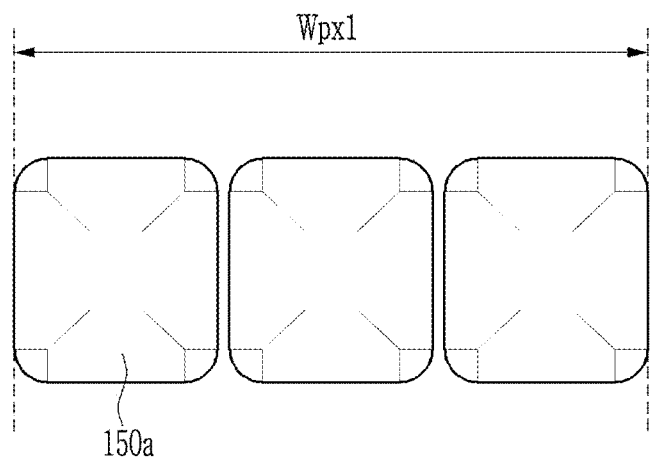
Figure 11:
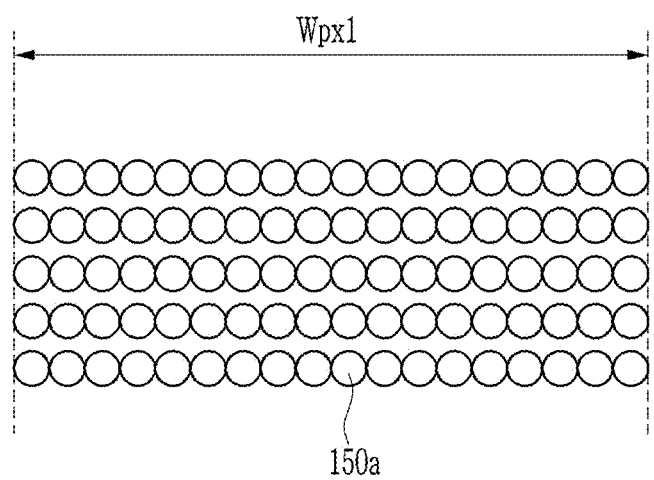

FIGS. 9 to 11 are views showing various arrangement relationships in pixel areas of the light-focusing parts.

For example, the first to third light-focusing parts 150a to 150c may be disposed with a planar lens, a micro-prism, a Fresnel lens, or a metamaterial in each overlapped pixel area (referring to FIG. 9), but is not limited thereto. For example, at least one of the first to third light-focusing parts 150a to 150c may include a plurality of light-focusing parts at an overlapped pixel area (referring to FIGS. 10 and 11).

The display device 11" according to an embodiment of FIG. 4 may include the light-focusing layer 150 having various sizes, shapes, arrangement relationships, e.g., relative positions, or a combination thereof depending on a material, a refractive index, a thickness, or the like of the neighboring first planarization layer 115 or sealing layer 119, and thus the light-focusing layer 150 may effectively focus the first light, as described above.

Figure 12:
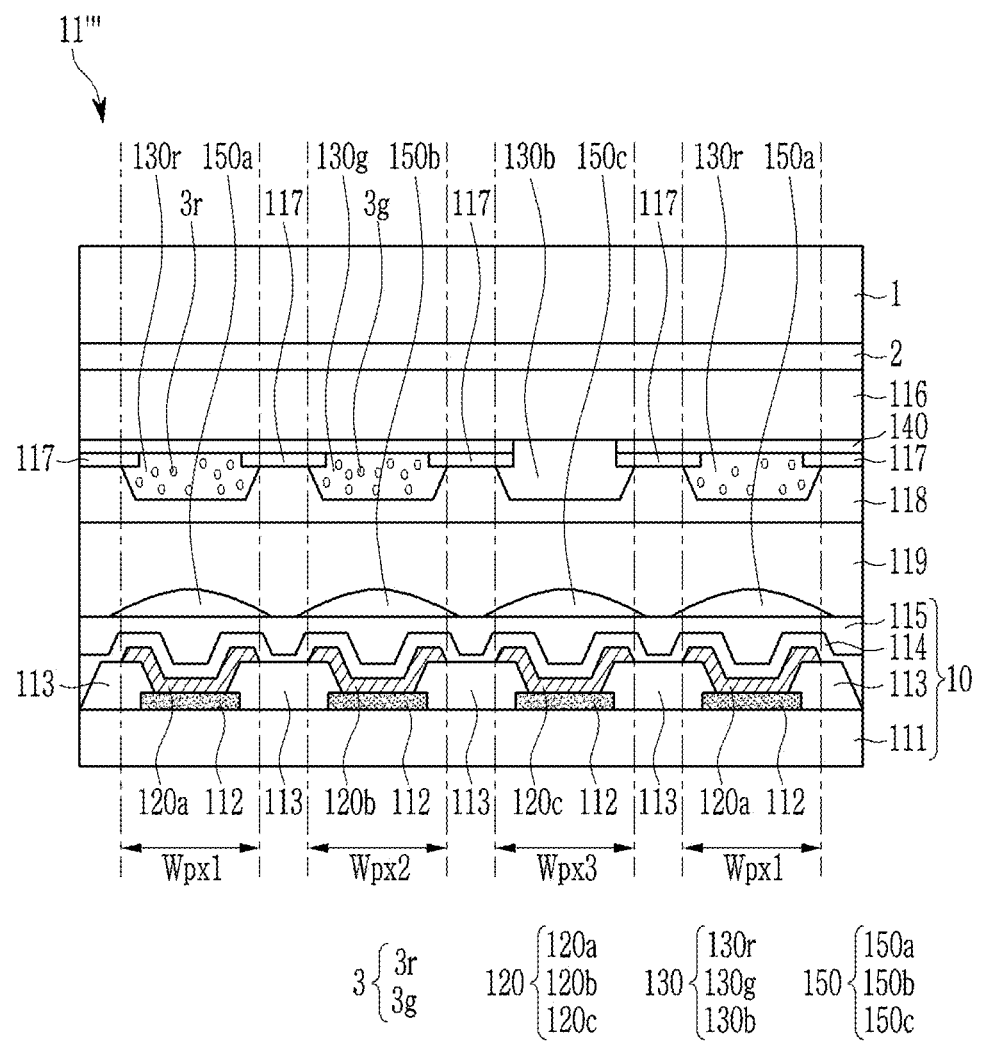
FIG. 12 is a cross-sectional view showing a display device according to an embodiment.

FIG. 12 is a cross-sectional view showing a display device according to an embodiment.

Referring to FIG. 12, the display device 11''' according to an embodiment may include all the constituent elements added in the display devices 11' and 11" according to embodiments of FIG. 3 and FIG. 4. In the display device 11''', the modifiable range of the optical filter layer 140 or the light-focusing layer 150 is the same as described with reference to embodiments of FIG. 3 and FIG. 4.

The display device 11''' according to an embodiment of FIG. 12 may express, e.g., display, an image having a high color purity in each pixel area through the optical filter layer 140 and control a light path of the first light in the device through the light focusing layer 150 to minimize the cross talk, e.g., interference, between adjacent pixel areas, in addition to the effects on improving photo-efficiency of the display device 11 according to an embodiment.

Hereinafter, characteristics of light emitted by the light source 10 according to an embodiment will be described with reference to FIGS. 13 to 18.

Figure 13:
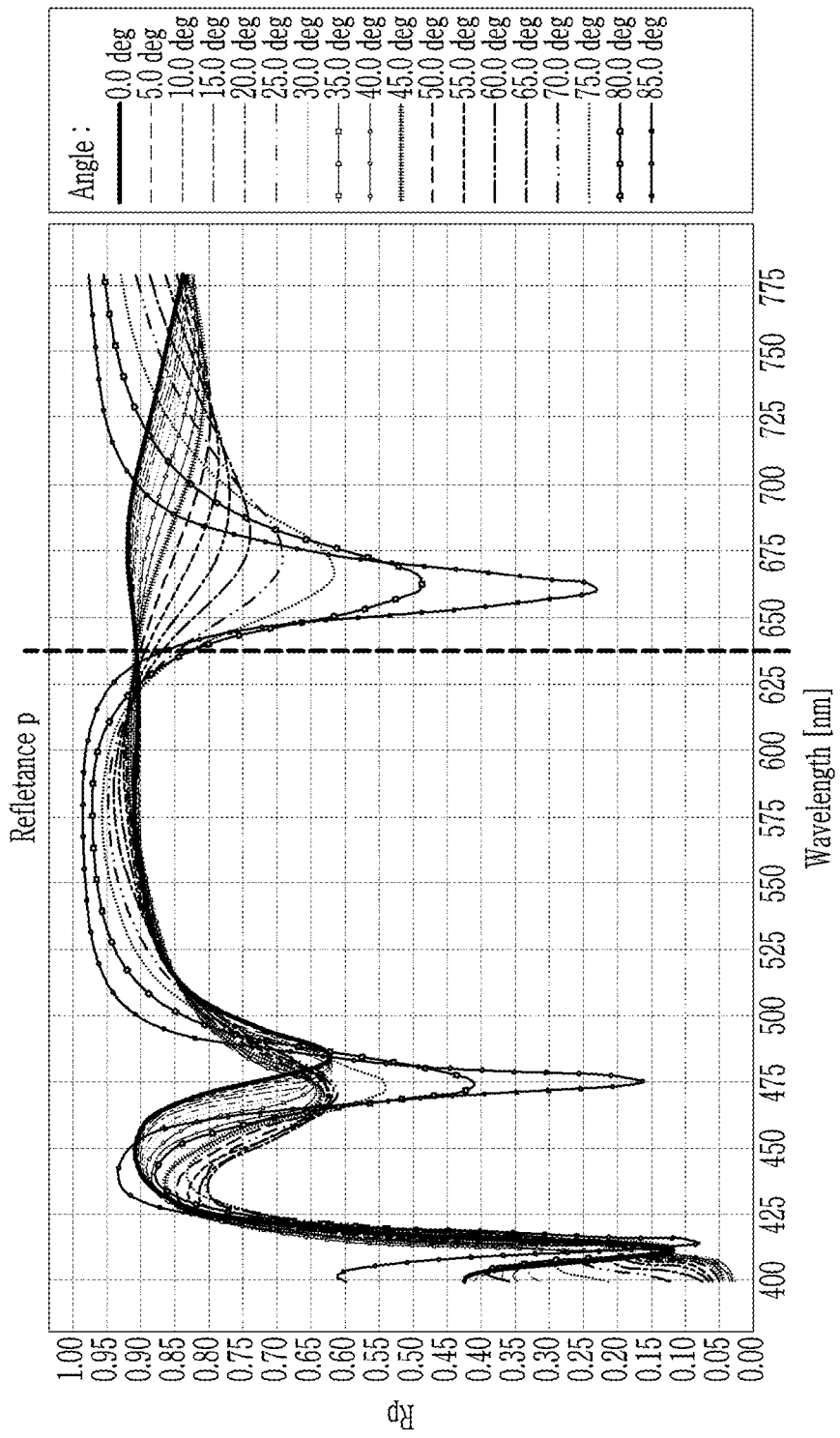
FIG. 13 is a graph of light reflectance versus wavelength (nm) of vertically polarized light (S polarized light) emitted from a first pixel area of a light source at various viewing angles according to an embodiment (top-emission case)
Figure 14:
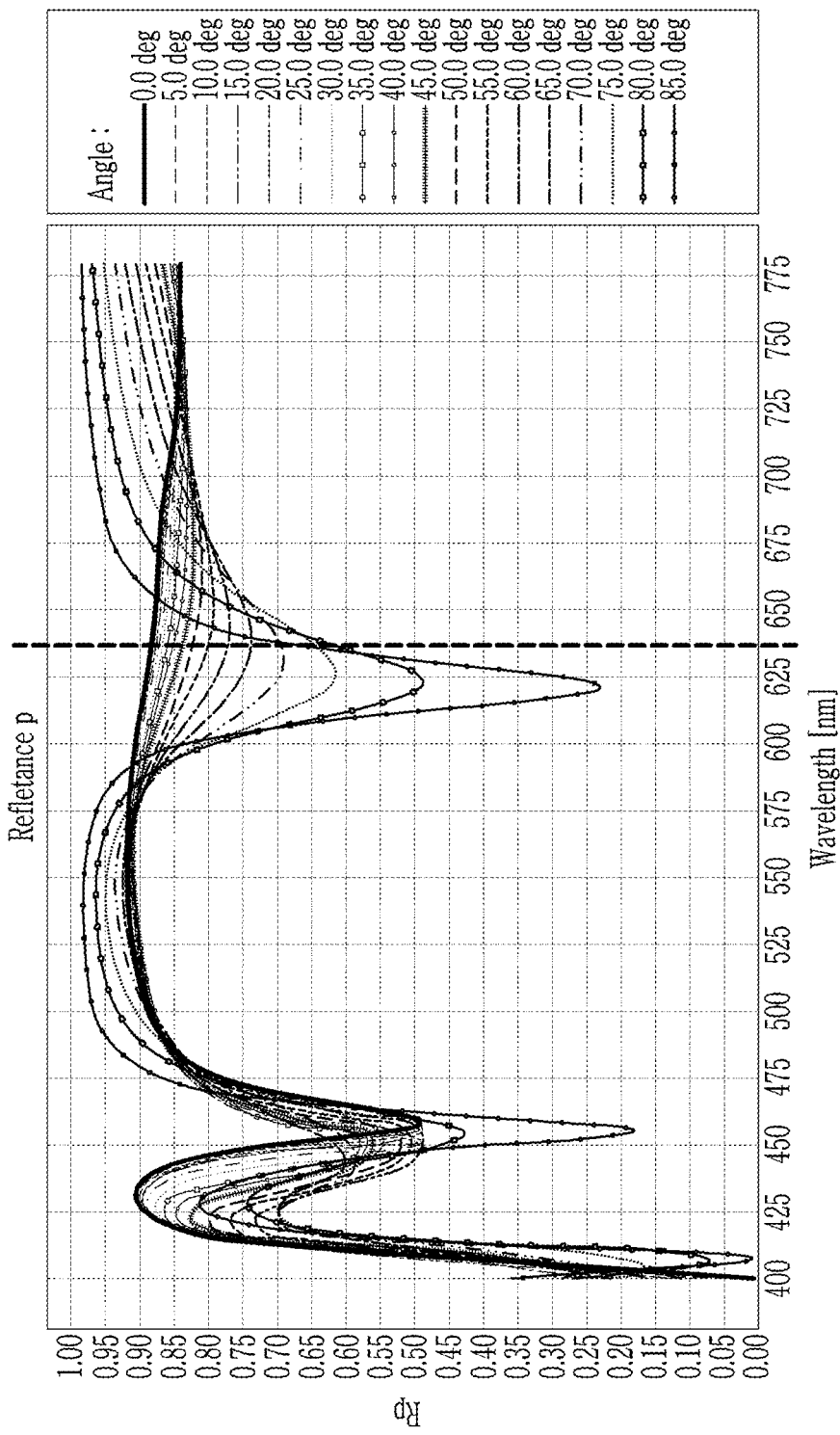
FIG. 14 is a graph of light reflectance versus wavelength (nm) of vertically polarized light (S polarized light) emitted from a first pixel area of a light source at various viewing angles that deviates from a light reflectance range of a first electrode according to an embodiment (top-emission case)

FIG. 13 is a graph showing a wavelength-light reflectance of vertically polarized light (S polarized light) according to a viewing angle change of light emitted from a first pixel area of a light source according to an embodiment (top-emission case) and FIG. 14 is a graph showing a wavelength-light reflectance of vertically polarized light (S polarized light) according to a viewing angle change of light emitted from a first pixel area of a light source that deviates from a light reflectance range of a first electrode according to an embodiment (top-emission case).

In FIGS. 13 and 14, center wavelengths of the red light emitted from the first pixel area are shown with a dotted line parallel to the y-axis.

Figure 15:
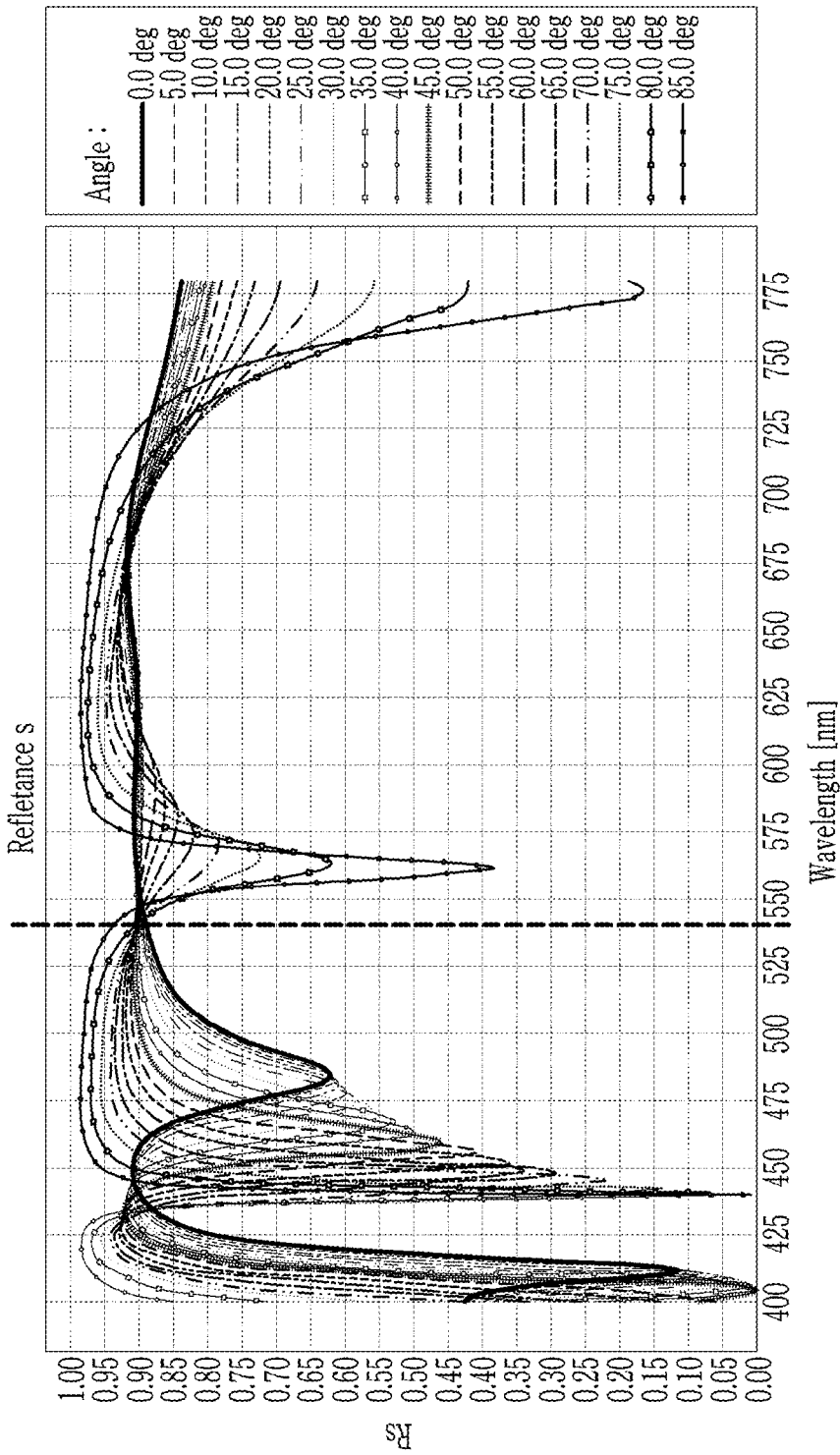
FIG. 15 is a graph of light reflectance versus wavelength (nm) of parallel polarized light (P polarized light) emitted from a second pixel area of a light source at various viewing angles according to an embodiment (top-emission case)
Figure 16:
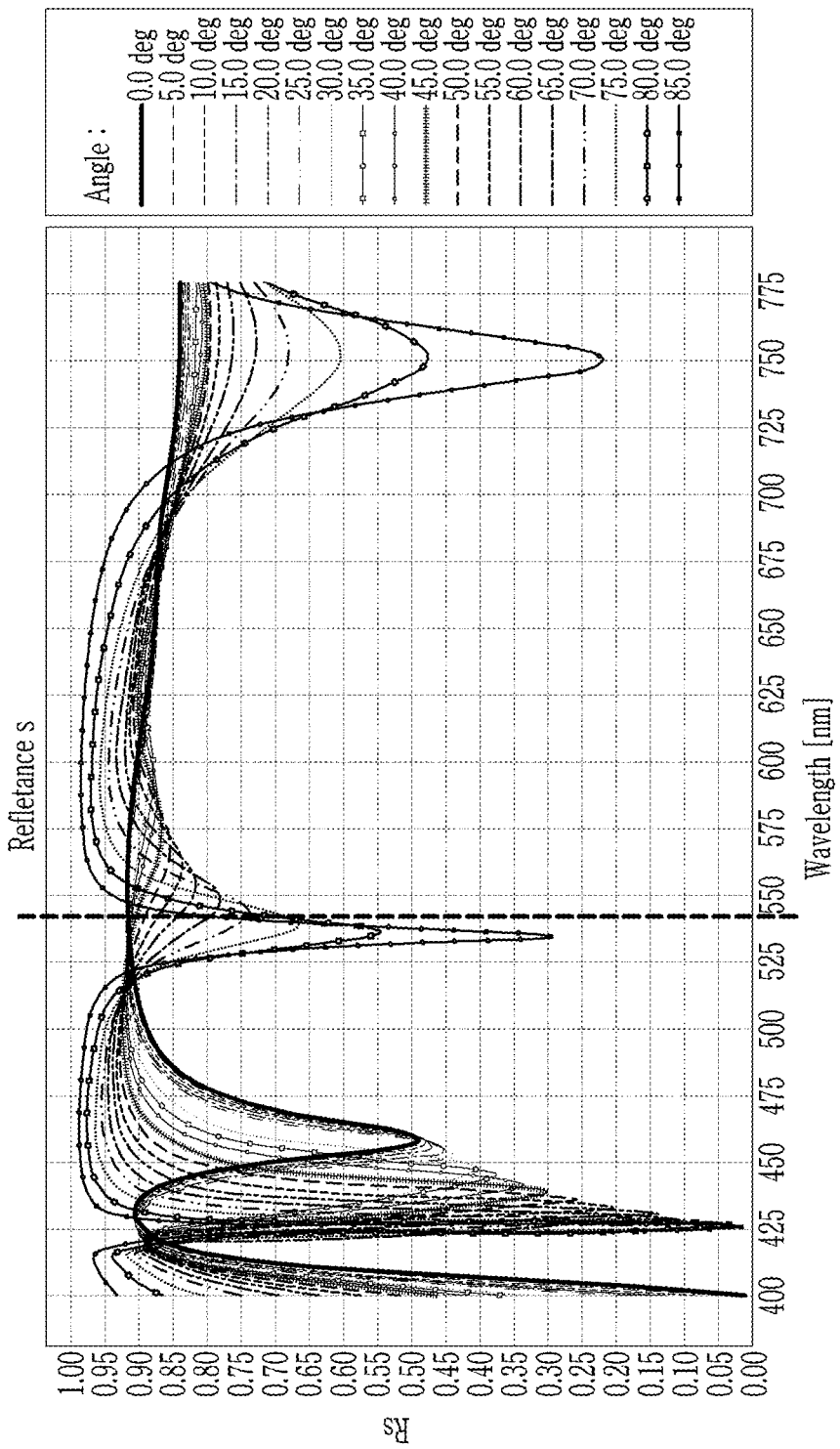
FIG. 16 is a graph of light reflectance versus wavelength (nm) of parallel polarized light (P polarized light) emitted from a second pixel area of a light source at various viewing angles that deviates from a light reflectance range of a first electrode according to an embodiment (top-emission case)

FIG. 15 is a graph showing a wavelength-light reflectance of horizontally polarized light (P polarized light) according to a viewing angle change, of light emitted from a second pixel area of a light source according to an embodiment (top-emission case); and FIG. 16 is a graph showing a wavelength-light reflectance of horizontally polarized light (P polarized light) according to a viewing angle change, of light emitted from a second pixel area of a light source which deviates from a light reflectance range of a first electrode according to an embodiment (top-emission case).

In FIGS. 15 and 16, center wavelengths of the green light emitted from the second pixel area are shown with a dotted line parallel to the y-axis.

Referring to FIGS. 13 and 15, a light source 10 has different light reflectance and light absorption according to a viewing angle change. The light reflectance of the wavelength region (a red wavelength region in the case of FIG. 13 and a green wavelength region in the case of FIG. 15) emitted from a corresponding pixel area is gradually decreased (light absorption is increased) according to increasing the viewing angle.

Referring to FIGS. 13 and 15, the light source 10 may have a first absorption peak (refer to FIG. 13) belonging to a wavelength region of about 650 nm to about 750 nm and a second absorption peak (refer to FIG. 15) belonging to a wavelength region of about 550 nm to about 600 nm with reference to, e.g., at, a viewing angle of about 55 degrees to about 85 degrees. That is, the light source 10 has a predetermined absorption capability with respect to the green and red wavelength regions within the viewing angle range. Such first and second absorption peaks may be dependent on resonance conditions of the light source, and this aspect is also applicable to the light sources (FIGS. 14 and 16) that deviate from the light reflectance range of the first electrode according to an embodiment.

In an embodiment, in the light source 10, a center wavelength of the second light (dotted line of FIG. 13) may be less than a center wavelength of the first absorption peak.

In an embodiment, in the light source 10, a center wavelength of the third light (dotted line of FIG. 15) may be less than a center wavelength of the second absorption peak.

When center wavelengths of the second light and/or the third light are less than the first and second absorption peak center wavelengths respectively, the area in which the red/green wavelength region absorbed in the light source 10 overlaps with wavelength region of red light/green lights emitted from the light source 10 may be minimized, or the red/green wavelength region absorbed in the light source 10 and the wavelength region of red light/green lights emitted from the light source 10 may not overlap with each other.

An effective absorption with respect to the second light in the light source according to an embodiment may be less than or equal to about 20%.

An effective absorption with respect to the third light in the light source according to an embodiment may be less than or equal to about 20%.

When the effective absorption with respect to the second and the third lights in the light source 10 according to an embodiment within a desirable range, the absorbed red/green wavelength region with respect to the wavelength region of red light/green light emitted from the color filter including quantum dots may be minimized. Thereby, the provided light source 10 may have excellent photo-efficiency of red light and green light converted by quantum dots 3.

When the light source is outside of a desirable light reflectance range of the first electrode according to an embodiment, center wavelengths of the second light/third light overlap with the first absorption peak center wavelength/second absorption peak center wavelength, respectively, or are greater than the first absorption peak center wavelength/the second absorption peak center wavelength.

In other words, when the light reflectance of the first electrode is outside of a desirable range, optical recycling effects may not be expected in the display device, and also the first and second absorption peaks of the light source may overlap with center wavelengths of the first and second lights or may be within a similar range. In this case, the first and second lights emitted from the light source may be absorbed, and photo-efficiency may be deteriorated.

Figure 17:
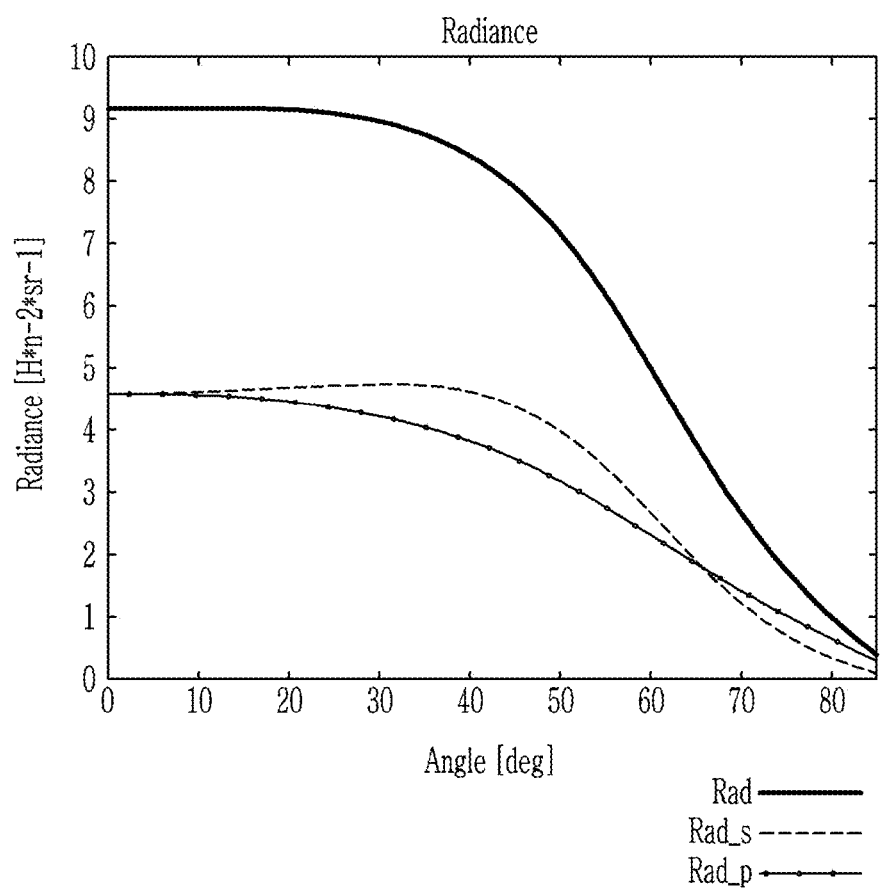
FIG. 17 is a graph of radiance versus viewing angle of a light source according to an embodiment (top-emission case)
Figure 18:
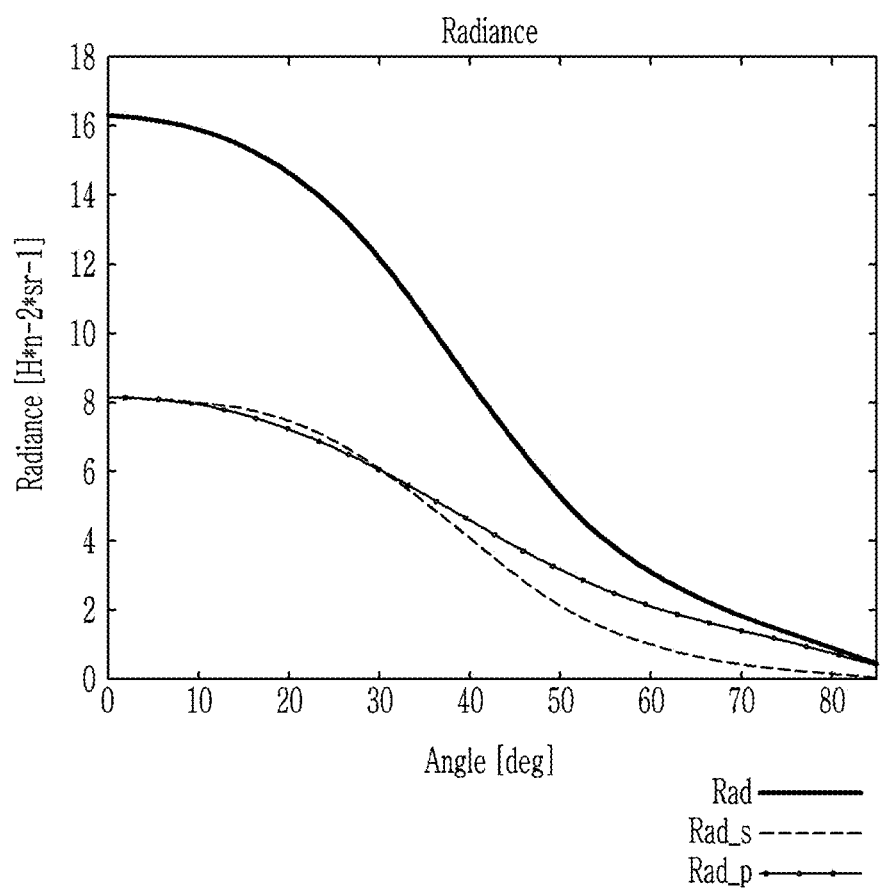
FIG. 18 is a graph of radiance versus viewing angle of a display device that deviates from a light reflectance range of a first electrode according to an embodiment (top-emission case)

FIG. 17 shows radiance with respect to a change in viewing angle of a light source according to an embodiment (top-emission case) and FIG. 18 shows radiance with respect to a change in viewing angle of a display device that deviates from a light reflectance range of a first electrode according to an embodiment (top-emission case).

Referring to FIG. 17, the radiance of the light source 10 of the display device 11 according to an embodiment is insignificantly changed even when the viewing angle is increased from 0 to about 40 degree.

The light source 10 may have a radiance decrease of, for example, less than or equal to about 30%, less than or equal to about 20%, less than or equal to about 15%, less than or equal to about 10%, or less than or equal to about 5% in a view angle of greater than 0 and less than or equal to about 40 degrees.

In addition, the light source 10 decreases the radiance with respect to that of the display device having a light reflectance which is outside of a desirable range of the first electrode according to an embodiment even in, e.g., at, a high, e.g., wide, viewing angle of greater than about 40 degrees. Each center wavelength of the first and second lights of the light source 10 may not overlap with center wavelengths of the first and second absorption peaks, and absorption of the first and second lights may be minimized.

Referring to FIG. 18, when the light source is outside of a desirable light reflection range of the first electrode according to an embodiment, the radiance is significantly deteriorated according to increasing the viewing angle, for example, the radiance is decreased to about 38% to about 50% at a viewing angle of greater than 0 and less than or equal to about 40 degrees. In addition, at a viewing angle of greater than about 40 degrees, the radiance is more sharply decreased compared to the light source 10 of the display device 11 according to an embodiment.

Therefore, the display device 11 according to an embodiment may utilize optical recycling of the first electrode 112 by including the light source 10 described above, and thereby may have an excellent photo-efficiency even in, e.g., at, a wide viewing angle range.

Figure 19:
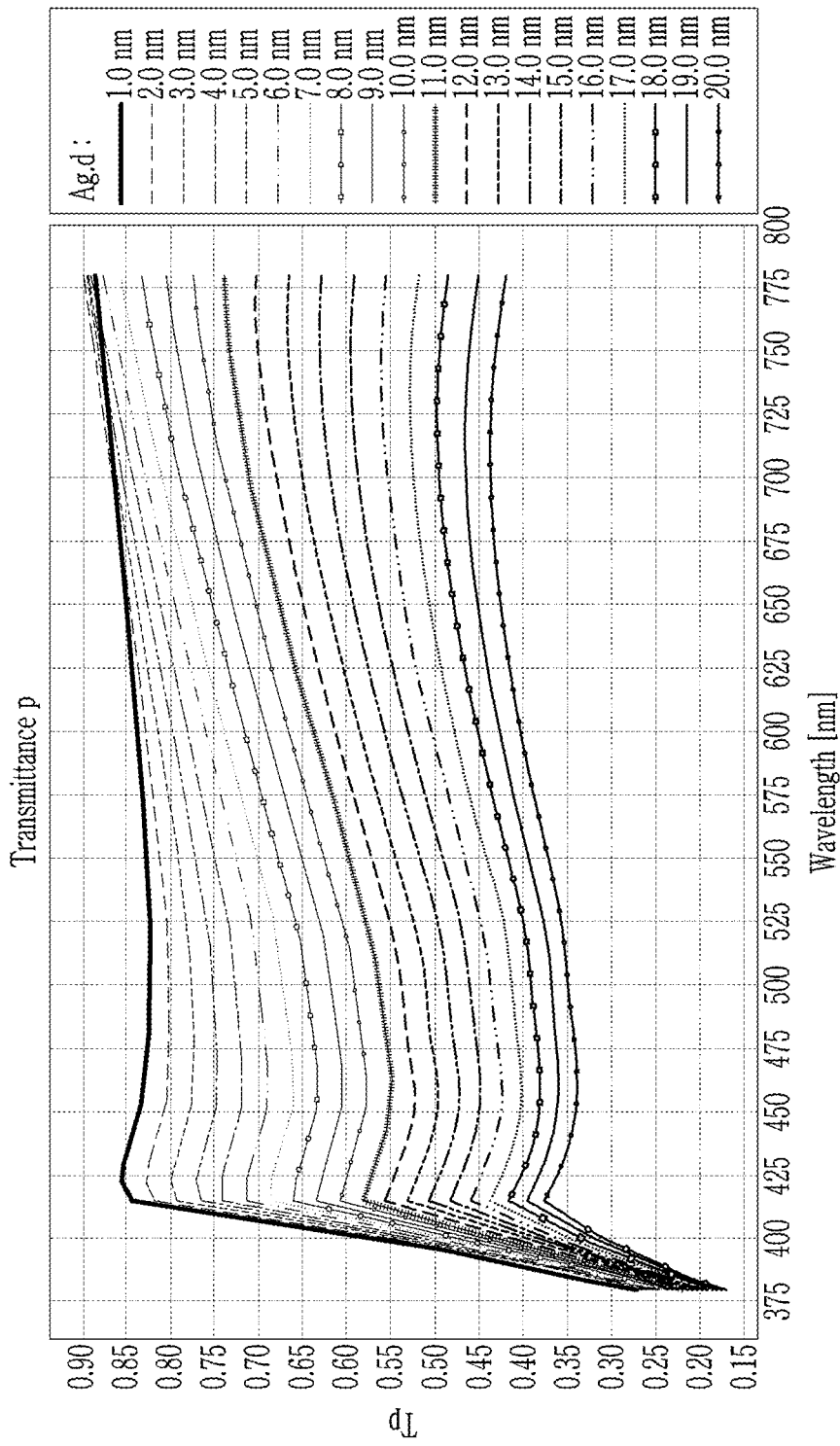
FIG. 19 is a graph of light transmittance versus a thickness of a second electrode of a light source (top-emission case)
Figure 20:
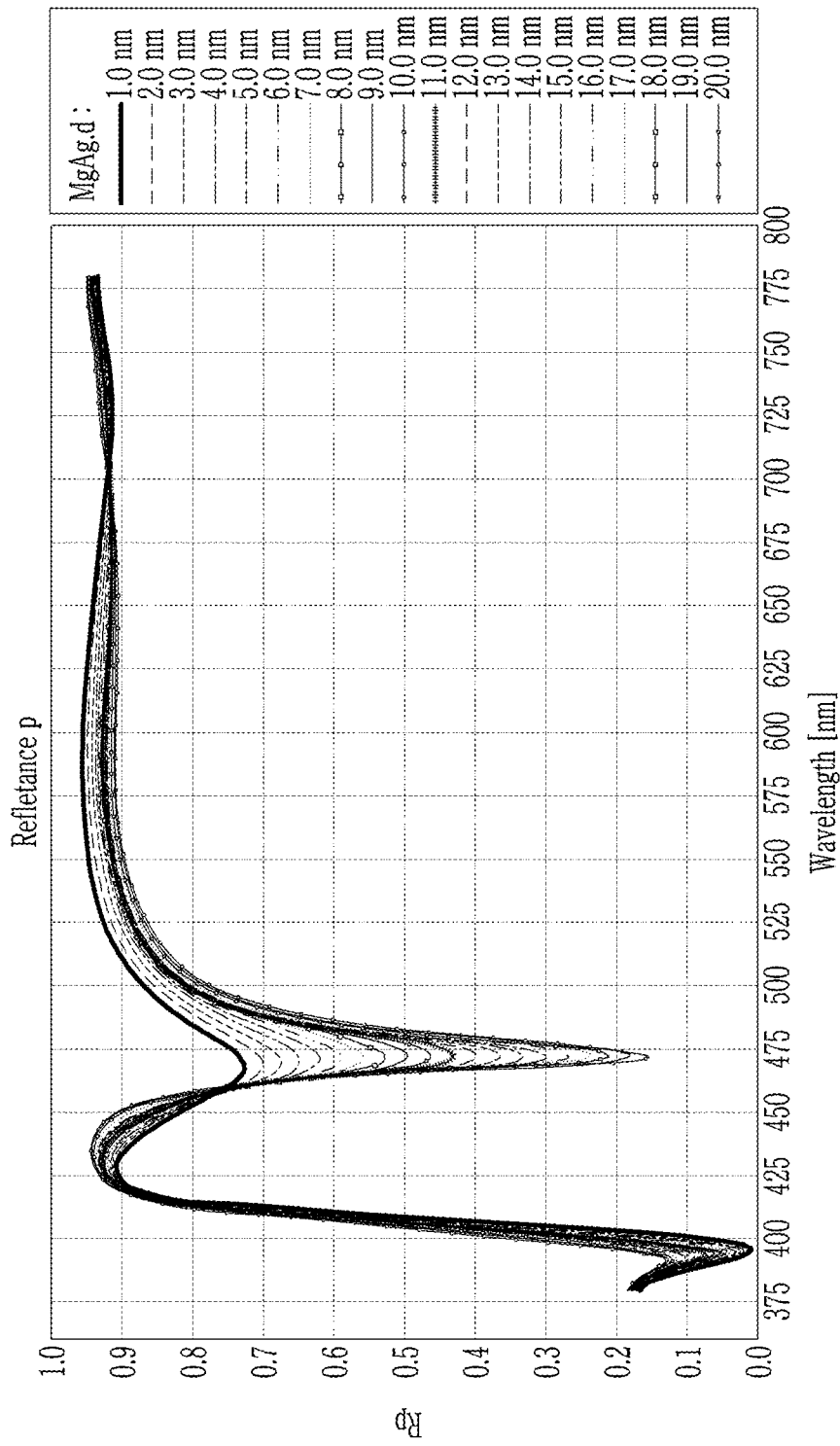
FIG. 20 is a graph of reflectance versus a thickness of a second electrode of a light source (top-emission case).

FIG. 19 is a graph of light transmittance versus a thickness of a second electrode of a light source (top-emission case) and FIG. 20 is a graph of reflectance versus a thickness of a second electrode of a light source (top-emission case).

First, referring to FIG. 19, the light source 10 of the display device 11 according to an embodiment has a light transmittance that varies with a thickness of the second electrode 114. Thereby, the light transmittance of the light source 10 is dependent upon a thickness of the second electrode 114.

Referring to FIG. 20, the light source 10 of the display device 11 according to an embodiment has a front light reflectance that varies with the thickness of the second electrode 114. The light transmittance of the light source is influenced by the thickness of the second electrode 114 as shown in FIG. 19, and the reflectance transmittance and the front light reflectance of the light source 10 are also dependent upon the thickness of the second electrode 114.

From the results of FIGS. 19 and 20, first light which is scattered to a rear side may be controlled not to be reabsorbed onto the light source 10 by adjusting the thickness of the second electrode 114. However, as described above, controlling the transmittance of the second electrode through the thickness adjustment is only an example of controlling the transmittance of the second electrode, and the transmittance may be controlled by various ways, for example, changing a material, a lamination relationship, and the like.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 1: cover layer | 2: adhesive layer |
| 3: quantum dot | 10: light source |
| 11: display device | 111: first substrate |
| 112: first electrode | 113: pixel define layer |
| 114: second electrode | 115: first planarization layer |
| 116: second substrate | 117: light blocking member |
| 118: second planarization layer | 119: sealing layer |
| 120: organic light emitting layer | 130: color filter layer |
| 140: optical filter layer | 150: light-focusing layer |

What is claimed is:

1. A method of forming a display device, the method comprising forming a light source comprising disposing an organic light emitting layer on a first electrode, the organic light emitting layer emitting a first light, the first electrode having a light reflectance for the first light of greater than or equal to about 60% disposing a second electrode on the organic light emitting layer to form the light source, the second electrode having a light transmittance in a visible wavelength region of greater than or equal to about 70%, wherein the light source has a first absorption peak in a wavelength region of about 650 nanometers to about 750 nanometers or a second absorption peak in a wavelength region of about 550 nanometers to about 600 nanometers at a viewing angle of about 55 degrees to about 85 degrees; and disposing a color filter layer above the light source to form the display device, the color filter layer comprising a quantum dot configured to convert the first light into a second light.

2. A display device, comprising
a light source comprising
a first electrode having a light reflectance for a first light of greater than or equal to about 60%,
an organic light emitting layer disposed on the first electrode, the organic light emitting layer emitting the first light, and
a second electrode disposed on the organic light emitting layer, the second electrode having a light transmittance in a visible wavelength region of greater than or equal to about 70%,
wherein the light source has a first absorption peak in a wavelength region of about 650 nanometers to about 750 nanometers or a second absorption peak in a wavelength region of about 550 nanometers to about 600 nanometers at a viewing angle of about 55 degrees to about 85 degrees; and
a color filter layer disposed above the light source, the color filter layer comprising a quantum dot configured to convert the first light into a second light.

3. The display device of claim 2, wherein
the first pixel area, the second pixel area, and the third pixel area are defined in the organic light emitting layer, and
the color filter layer comprises a first color filter, a second color filter, and a third color filter at positions which overlap with the first color filter, the second color filter, and the third pixel area, respectively.

4. The display device of claim 2, wherein
the color filter layer further comprises a quantum dot configured to convert the first light into a third light different from the second light,
a center wavelength of the second light is less than a center wavelength of the first absorption peak, and
a center wavelength of the third light is less than a center wavelength of the second absorption peak.

5. The display device of claim 2, wherein the first electrode comprises silver (Ag), aluminum (Al), gallium (Ga), indium (In), gold (Au), platinum (Pt), nickel (Ni), tungsten (W), chromium (Cr), molybdenum (Mo), iron (Fe), cobalt (Co), copper (Cu), palladium (Pd), titanium (Ti), indium tin oxide (ITO), or a combination thereof.

6. The display device of claim 3, wherein the second color filter comprises the quantum dot configured to convert the first light into the second light, and
the third color filter comprises a quantum dot configured to convert the first light into a third light different from the second light.

7. The display device of claim 2, wherein
a first pixel area, a second pixel area, and a third pixel area are defined in the organic light emitting layer, and
each of the first pixel area, the second pixel area, and the third pixel area emits the first light.

8. The display device of claim 2, wherein the quantum dot comprises a Group II-VI compound, a Group III-V compound, a Group IV-VI compound, a Group IV compound, a Group II-III-VI compound, a Group I-II-IV-VI compound, or a combination thereof.

9. The display device of claim 2, wherein the light source exhibits a radiance decrease of less than or equal to about 20% at a viewing angle of greater than 0 degree and less than or equal to about 40 degrees.

10. The display device of claim 2, wherein an effective absorption with respect to the second light of the light source is less than or equal to about 20%.

11. The display device of claim 2, wherein the first light has a center wavelength in a wavelength region of about 440 nanometers to about 550 nanometers.

12. The display device of claim 2, wherein a center wavelength of the second light is less than a center wavelength of the second absorption peak.

13. The display device of claim 2, wherein a center wavelength of the second light is less than a center wavelength of the first absorption peak.

14. The display device of claim 2, wherein the color filter layer further comprises a light scattering material.

15. The display device of claim 2, wherein the first light is blue light and the second light is red light.

16. The display device of claim 15, wherein the color filter layer further comprises a quantum dot configured to convert the first light into green light.

17. The display device of claim 2, wherein the display device is disposed between the second electrode and the color filter layer and further comprises a light-focusing layer configured to focus the first light emitted from the organic light emitting layer into the color filter layer.

18. The display device of claim 17, wherein the light-focusing layer comprises a convex lens, a micro prism, a plane lens, a Fresnel lens, a metamaterial, or a combination thereof.

19. The display device of claim 18, wherein
a first pixel area, a second pixel area, and a third pixel area are defined in the organic light emitting layer, and
the light-focusing layer comprises a first light-focusing portion, a second light-focusing portion, and a third light-focusing portion at positions overlapping the first pixel area, the second pixel area, and the third pixel area, respectively.

20. The display device of claim 2, wherein the display device further comprises an optical filter layer disposed on the color filter layer, the optical filter layer configured to block at least a portion of the first light.

21. The display device of claim 20, wherein optical filter layer blocks light having a wavelength of less than or equal to about 500 nanometers.

22. The display device of claim 20, wherein
a first pixel area, a second pixel area, and a third pixel area are defined in the organic light emitting layer, and
the optical filter layer is disposed at a position overlapping the second pixel area, a position overlapping the third pixel area, or a combination thereof.

23. The display device of claim 22, wherein the optical filter layer is integrally formed at positions other than the position overlapping the first pixel area.

* * * * *